US006596462B2

(12) United States Patent
Mori

(10) Patent No.: US 6,596,462 B2
(45) Date of Patent: Jul. 22, 2003

(54) PRINTING PLATE ELEMENT AND PREPARATION METHOD OF PRINTING PLATE

(75) Inventor: Takahiro Mori, Tokyo (JP)

(73) Assignee: Konica Corporation, Tokyo (JP)

( * ) Notice: Subject to any disclaimer, the term of this patent is extended or adjusted under 35 U.S.C. 154(b) by 237 days.

(21) Appl. No.: 09/732,682

(22) Filed: Dec. 8, 2000

(65) Prior Publication Data

US 2001/0010892 A1 Aug. 2, 2001

(30) Foreign Application Priority Data

Dec. 17, 1999 (JP) ........................................ 11-358969
Sep. 13, 2000 (JP) ........................................ 2000-277926

(51) Int. Cl.$^7$ ........................................ G03F 7/00

(52) U.S. Cl. ........................ 430/272.1; 430/273.1; 430/281.1; 430/302; 430/348; 430/944; 430/945; 430/964; 101/453; 101/455; 101/456; 101/463.1; 101/465; 101/467

(58) Field of Search ........................ 430/270.1, 271.1, 430/272.1, 273.1, 281.1, 348, 302, 944, 945, 964; 101/130, 453, 454, 455, 456, 463.1, 465, 467

(56) References Cited

U.S. PATENT DOCUMENTS

| | | | | | |
|---|---|---|---|---|---|
| 3,382,069 | A | | 5/1968 | Borchers et al. | 96/33 |
| 6,096,476 | A | * | 8/2000 | Yanagida et al. | 430/270.1 |
| 6,106,996 | A | * | 8/2000 | Van Damme et al. | 430/271.1 |
| 6,197,478 | B1 | * | 3/2001 | Vermeersch et al. | 430/272.1 |
| 6,300,032 | B1 | * | 10/2001 | Van Damme et al. | 430/188 |
| 6,367,383 | B1 | * | 4/2002 | Leenders et al. | 101/465 |
| 6,379,863 | B1 | * | 4/2002 | Oohashi et al. | 430/270.1 |
| 6,399,270 | B1 | * | 6/2002 | Mori et al. | 430/270.1 |
| 2001/0024766 | A1 | * | 9/2001 | Kita et al. | 430/272.1 |
| 2002/0009574 | A1 | * | 1/2002 | Hiraoka | 428/158 |
| 2002/0033108 | A1 | * | 3/2002 | Akiyama et al. | 101/457 |

FOREIGN PATENT DOCUMENTS

| | | | |
|---|---|---|---|
| EP | 0 510 646 A1 | 10/1992 | G03F/7/027 |
| EP | 0 770 495 A1 | 5/1997 | B41M/5/36 |
| EP | 0 849 091 A1 | 6/1998 | B41M/5/36 |
| JP | 1-95098 | 4/1989 | B41M/1/14 |
| JP | 4-275195 | 9/1992 | B41N/3/04 |

OTHER PUBLICATIONS

Grant, Roger, and Claire Grant, eds. Grant & Hackh's Chemical Dictionary, 5$^{th}$ ed. New York, McGraw–Hill Book Company, 1987. p. 463.*

Robert, John, D., and Marjorie C. Caserio. Modern Organic Chemistry. New York, W. A. Benjamin, Inc., 1967. p. 431.*

* cited by examiner

*Primary Examiner*—Janet Baxter
*Assistant Examiner*—Barbara Gilliam
(74) *Attorney, Agent, or Firm*—Frishauf, Holtz, Goodman & Chick, P.C.

(57) ABSTRACT

A printing plate element is disclosed, comprising a substrate and a component layer containing a first material which is water-insoluble or capable of varying from being water-soluble to being water-insoluble at a prescribed temperature of not less than 60° C. and a second material which is water-soluble and has a melting point of 60 to 300° C. A method of preparing a printing plate is also disclosed, comprising imagewise exposure of the printing plate element and removing an unexposed area of the printing plate element with aqueous solution.

20 Claims, 1 Drawing Sheet

PRINTING PLATE ELEMENT AND PREPARATION METHOD OF PRINTING PLATE

FIELD OF THE INVENTION

The present invention relates to a printing plate element and particularly to a printing plate element capable of forming an image by a computer to plate (CTP) system. The invention also relates to the preparation method of the printing plate element or a printing plate.

BACKGROUND OF THE INVENTION

An element for CTP which can be easily handled and has a printing ability comparable with that of a PS plate is required accompanied with the digitization of printing data. Recently, many types of CTP by infrared laser recording have been proposed. Among them, a dry CTP including a developing process of the printing machine is noticed, by which a specific developing process is not required. Examples of such the techniques are described in Japanese Patent Publication Open to Public Inspection, hereinafter referred to as JP O.P.I., Nos. 8-507727, 6-186750, 6-199064, 7-314934, 10-58636 and 10-244773.

These are all printing elements each forming an image area or non image area by ablation of the surface layer thereof. Such the printing elements each has problems that the resolving power and the dot quality are low.

Moreover, it is a problem that the contamination of the interior of the exposing apparatus by the scattered matter caused by the ablation of the surface layer. Accordingly, it is often necessary to have a built-in cleaning means such as a specific sucking device or a contamination preventing means such as to cover the surface of the printing plate element by a cover sheet, for solving such the problem. Furthermore, the process cannot be regarded to a complete dry process since it is necessary to remove the ablation residue remained on the plate surface by a means such as wiping or rinsing by an exclusive device.

Besides, a process is called as a wet type CTP in which the solubility to a developer of the image forming layer of the printing plate element is changed by the exposure to light and the image is formed by the development. Such the process has advantages that the anxiety of contamination of interior of the exposing apparatus is little and the high resolving ability can be obtained. However, other problems are caused, such as that an exclusive alkaline developer is necessary to development and the handling ability in a lighted room of the printing plate element is limited since the change in the solubility of the image forming layer is accompanied with a chemical reaction.

SUMMARY OF THE INVENTION

The object of the invention is to provide a printing plate element which can be easily handled in a lighted room and is capable of directly forming an image by infrared laser irradiation without an anxiety of contamination of the interior of exposing apparatus, and no specific developing treatment is necessary. Moreover, the object of the invention is to provide a printing plate element having a high resolving power which is protected from a stain caused scratches. Furthermore, the object of the invention is to provide a production method of such the printing plate element and a printing plate.

The object of the invention can be attained by the followings:

1. A printing plate element comprising a substrate and a first component layer, wherein the first component layer contains a first material which is water-insoluble or capable of varying from being water-soluble to being water-insoluble at a prescribed temperature of not less than 60° C. and a second material which is water-soluble and has a melting point of 60 to 300° C.;
2. The printing plate element described in 1, wherein the second material is a crystalline material;
3. The printing plate element described in 1, wherein the printing plate element comprises a second hydrophilic component layer provided between the substrate and the first component layer;
4. The printing plate element described in 3, wherein the second component layer is a porous layer;
5. The printing plate element described in 3, wherein the second component layer contains a light-heat conversion material;
6. The printing plate element described in 3, wherein the second component layer contains an alkaline colloidal silica and a water soluble polysaccharide;
7. The printing plate element described in 3, wherein the second component layer has a protruding surface structure having a pitch of from 0.1 to 50 μm;
8. The printing plate element described in 3, wherein the printing element comprises a third component layer provided between the substrate and the second component layer, the third component layer containing a light-heat conversion material;
9. The printing plate element described in 1, wherein the first material is a material 1*a* which is water-insoluble and has a melting point of 60 to 300° C.;
10. The printing plate element described in 9, wherein the melting point of the second material is higher than that of the material 1*a;*
11. The printing plate element described in 9, wherein the material 1*a* is in the form of particles, and having an average particle size of 0.01 to 10 μm;
12. The printing plate element described in 9, wherein the material 1*a* is at least one selected from the group consisting of polyethylene, microcrystalline wax, a fatty acid and a fatty acid ester;
13. The printing plate element described in 1, wherein the first material is a material 1*b* which is water soluble and capable of coagulating at a temperature of not less than 60° C. to form a water-insoluble coagulant;
14. The printing plate element described in 13, wherein the material 1*b* is at least one selected from the group consisting of a water-soluble protein and a water-soluble glycoprotein;
15. The printing plate element described in 1, wherein the second material has a melting point of 70 to 260° C.;
16. The printing plate element described in 1, wherein the second material is an oligosaccharide;
17. The printing plate element described in 16, wherein the oligosaccharide is at least one selected from the group consisting of trehalose, maltose, galactose, sucrose, lactose and raffinose;
18. A method of preparing a printing plate comprising the steps of:
    (a) imagewise exposing a printing plate element to laser light and (b) removing an unexposed area of the printing plate element with an aqueous solution, wherein printing plate element comprising a substrate and a first component layer, wherein the first component layer contains a first material which is water-insoluble or capable of varying from being water-soluble to being water-insoluble at a prescribed temperature of not less than 60° C. and a second material which is water-soluble and has a melting point of 60 to 300° C., and wherein in step (b), an unexposed area of the first component layer is removed;

19. The method described in 18, wherein step (b) is performed on a printing machine;

20. A printing plate element comprising a substrate having thereon a layer A containing a material 1 which is water-insoluble or capable of varying from being water-soluble to being water-insoluble at a temperature not less than 60° C., and a material 2 which is water-soluble and crystalline and has a melting point within the range of from 60° to 300° C.;

21. The printing plate element described in 20, wherein the printing plate element has a hydrophilic layer B provided between the layer A and the substrate;

22. The printing plate element described in 21, wherein the hydrophilic layer B is a porous layer;

23. The printing plate element described in 21 or 22, wherein the hydrophilic layer B contains a light-heat conversion material;

24. The printing plate element described in any one of 21 to 23, wherein the hydrophilic layer B contains an alkaline colloidal silica and a water-soluble polysaccharide, and having a protruding structure having a pitch of from 0.1 to 50 $\mu$m on the surface thereof;

25. The printing plate element described in any one of 21 to 24, wherein the printing plate element has a layer C containing a light-heat conversion material provided between the hydrophilic layer B and the substrate;

26. The printing plate element described in any one of 20 to 25, wherein the material 1 is a material 1*a* which is water-insoluble and has a melting point within the range of from 60° to 300° C.;

27. The printing plate element described in 26, wherein the melting point of the material 2 is higher than that of the material 1*a;*

28. The printing plate element described in any one of 20 to 25, wherein the material 1 is a material 1*b* which is capable of being coagulated to form a water-insoluble material at a temperature of not less than 60° C.;

29. The printing plate element described in 28, wherein the material 1*b* is a water-soluble protein or a water-soluble glycoprotein;

30. The printing plate element described in any one of 20 to 29, wherein the material 2 has a melting point within the range of from 70° to 260° C.;

31. The printing plate element described in any one of 20 to 30, wherein the material 2 is an oligosaccharide;

32. The printing plate element described in 31, wherein the oligosaccharide is selected from the group consisting of trehalose, maltose, galactose, sucrose, lactose and raffinose;

33. A method for preparing a printing plate comprising the steps of imagewise exposing the printing plate element described in any one of 1 to 13, to laser light, and removing an unexposed area of the layer A by an aqueous solution;

34. The method for preparing a printing plate described in 33, wherein the step of removing the unexposed area of the layer A by an aqueous solution is performed on a printing machine;

35. A method for preparing a printing plate element comprising the steps of making a mixture of a powdery material 1*b* capable of forming a water-insoluble coagulant upon coagulation at a temperature of not less than 60° C. and a powdery material 2 having a melting point within the range of from 60° to 300° C. which is water-soluble and crystalline, dissolving the mixture into water to make an aqueous coating solution, and coating the aqueous solution on a substrate and drying;

36. A printing plate element comprising a substrate having thereon a layer A containing at least one of a water-soluble protein and glycoprotein;

37. The printing plate element described in 36, wherein the printing plate element comprises a hydrophilic layer B between the substrate and the layer provided on the substrate;

38. The printing plate element described in 36 or 37, wherein the layer A contains a saccharide or its derivative;

39. The printing plate element described in 37 or 38, wherein the hydrophilic layer B contains a light-heat conversion material;

40. The printing plate element described in 37 or 38, wherein the printing plate element comprises a layer C containing a light-heat conversion material which is provided between the substrate and the layer B;

41. The printing plate element described in any one of 38 to 40, wherein the saccharide contained in the layer A provided on the substrate is an oligosaccharide;

42. The printing plate element described in 41, wherein the oligosaccharide is trehalose;

43. The printing plate element described in any one of 36 to 42, wherein the water-soluble protein contained in the layer A provided on the substrate ovalbumin;

44. The printing plate element described in any one of 36 to 43, wherein the layer provided on the substrate contains a ink adhesion-improving material;

45. The printing plate element described in any one of 36 to 44, wherein the layer A provided on the substrate contains a lubricant;

46. The printing plate element described in any one of 36 to 45, wherein the layer A provided on the substrate contains a matting agent;

47. The printing plate element described in any one of 36 to 46, wherein the hydrophilic layer B is a porous layer;

48. The printing plate element described in any one of 37 to 47, wherein the hydrophilic layer B exhibits alkalinity in the form of a coating solution;

49. The printing plate element described in any one of 37 to 48, wherein the hydrophilic layer B contains at least one selected from the group consisting of a water-soluble protein, a water soluble glycoprotein, a saccharide and its derivative;

50. A method for preparing a printing plate element comprising a substrate having a layer A containing at least one of a water-soluble protein and a water-soluble glycoprotein, the method comprising:

mixing a powder of at least one of the water-soluble protein and glycoprotein with a powdery water-soluble resin to form a powdery mixture, dissolving the mixture in water to form an aqueous coating solution, and coating the solution on a substrate and drying to form a layer A;

51. An image forming method comprising:

imagewise exposing a printing plate element comprising a substrate having thereon a layer A containing at least one of a water-soluble protein and a water-soluble glycoprotein to near-infrared laser light to cause all or a part of the exposed layer A to coagulate and removing an non-coagulated area of the layer A by dissolution with water to form an image;

52. A method for preparing a printing plate comprising:

imagewise exposing a printing plate element comprising a substrate having thereon a layer A containing at least one of a water-soluble protein and a water-soluble glycoprotein to near-infrared laser light to cause all or a part of the exposed layer A to coagulate and removing an non-coagulated area of the layer A by dissolution with water to prepare a printing plate;

53. An image forming method comprising:

imagewise providing an acid containing ink on the surface of a printing plate element comprising a substrate having thereon a layer A containing at least one of a water-soluble protein and a water-soluble glycoprotein through an ink-jet system to cause all or a part of an ink-provided area of the layer A to coagulate and removing an non-coagulated area of the layer A by dissolution with water to form an image;

54. The image forming method described in 53, wherein the ink comprises plural inks different in at least one of the kind and the amount of the contained light-heat conversion material, and a difference in the kind of the ink is caused in the extent of coagulation in the ink-provided area of the layer A to enhance gradation;

55. A method for preparing a printing plate comprising:

imagewise providing an acid containing ink on the surface of a printing plate element comprising a substrate having thereon a layer A containing at least one of a water-soluble protein and a water-soluble glycoprotein through an ink-jet system to cause all or a part of an ink-provided area of the layer A to coagulate and removing an non-coagulated area of the layer A by dissolution with water to prepare a printing plate;

56. The method described in 55, wherein the ink comprises plural inks different in at least one of the kind and the amount of the contained acid, a difference in the kind of the ink is caused in the extent of coagulation in the ink-provided area of the layer A to enhance gradation;

57. An image forming method comprising:

imagewise providing an ink containing a light-heat conversion material on the surface of a printing plate element comprising a substrate having thereon a layer A containing at least one of a water-soluble protein and a water-soluble glycoprotein through an ink-jet system exposing overall to light having a wavelength within the absorption wavelengths region of the light-heat conversion material to cause all or a part of an ink-provided area of the layer A to coagulate and removing an non-coagulated area of the layer A by dissolution with water to form an image;

58. The image forming method described in 57, wherein the ink comprises plural inks different in at least one of the kind and the amount of the contained light-heat conversion material, and a difference in the kind of the ink is caused in the extent of coagulation in the ink-provided area of the layer A to enhance gradation;

59. A method for preparing a printing plate comprising:

imagewise providing an ink containing a light-heat conversion material on the surface of a printing plate element comprising a substrate having thereon a layer A containing at least one of a water-soluble protein and a water-soluble glycoprotein through an ink-jet system exposing overall to light having a wavelength within the absorption wavelengths region of the light-heat conversion material to cause all or a part of an ink-provided area of the layer A to coagulate and removing an non-coagulated area of the layer A by dissolution with water to form an image;

60. The method described in 59, wherein the ink comprises plural inks different in at least one of the kind and the amount of the contained light-heat conversion material, and a difference in the kind of the ink is caused in the extent of coagulation in the ink-provided area of the layer A to enhance gradation;

61. The image forming method described in any one of 51, 53, 54, 57 and 58, wherein the step of removing the non-coagulated area of the layer A by dissolution with water is performed on a printing machine;

62. The method described in any one of 52, 55, 56, 59 and 60, wherein the step of removing the non-coagulated area of the layer A by dissolution with water is performed on a printing machine;

63. The image forming method described in any one of 51, 53, 54, 57, 58 and 61, wherein the method further comprises a step of drying the ink between steps of providing an ink and removing the non-coagulated area by dissolution with water;

64. The method described in any one of 52, 55, 56, 59, 60 and 62, wherein the method further comprises a step of drying the ink between steps of providing an ink and removing the non-coagulated area by dissolution with water;

65. The image forming method described in any one of 51, 53, 54, 57, 58 and 61, wherein the method further comprises a step of drying the ink between steps of providing an ink and exposing overall;

66. The method described in any one of 52, 55, 56, 59, 60 and 62, wherein the method further comprises a step of drying the ink between steps of providing an ink and exposing overall.

Further preferable embodiments of the invention are described in the followings:

a. The layer A contains both of the materials 1*b* and 1*a*.

b. The material 1*a* has a shape of granule and the average grain size is within the range of from 0.01 to 10 μm.

c. The averaged grain size of the granule-shaped material 1*a* is within the range of from 0.1 to 3 μm.

d. The material 1 is selected from the group consisting of a polyethylene, a microcrystalline, a fatty acid ester and a fatty acid.

e. The water-soluble protein is ovalbumin.

f. The alkaline colloidal silica is a necklace-shaped colloidal silica.

g. The alkaline colloidal silica includes a necklace-shaped silica and a spherical silica having an average particle size of from 3 to 20 nm.

h. The water-soluble polysaccharide is a cellulose derivative.

i. The cellulose derivative is a salt of carboxymethyl cellulose.

DESIGNATION OF NUMERALS

Figure 1:
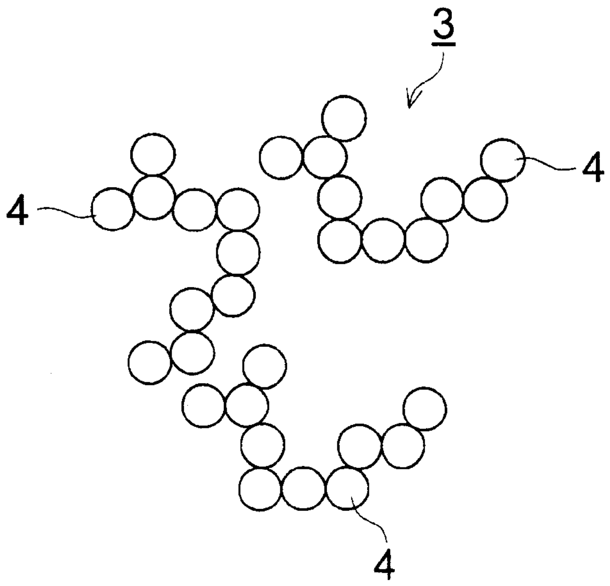
FIG. 1 shows a schematic illustration of an example of dispersion structure of the necklace-shaped colloidal silica.

1: Conventional silica
2: Spherical silica
3: Necklace-shaped silica
4: Spherical silica

DETAILED DESCRIPTION OF PREFERRED EMBODIMENTS

The printing plate element according to the invention comprises a substrate and the first component layer. The first component layer contains the first material which is water-insoluble or capable of varying from being water-soluble to being water-insoluble at a prescribed temperature of not less than 60° C., and the second material which is water-soluble, exhibiting a melting point of 60 to 300° C. Hereinafter, the first component layer is also denoted as a layer A or an image forming layer. The fist material a or first material b is also denoted as material 1*a* or material 1*b*. The second material is also denoted as material 2. The second component layer is also denoted as a hydrophilic layer B. The third component layer is also denoted as a layer C.

The invention is carried out to improve the problem of contamination of the interior of the exposing apparatus, the nuisance of attaching the contamination preventing means, and the necessity of exclusive alkaline developer and the limitation on the handling ability in a lighted room of the wet type CTP. It has been found by the inventors as a result of investigation on the image forming material of CTP that an image forming layer containing a specific water-insoluble material or a specific material capable of changing to water-insoluble at a temperature of not less than 60° C., and a specific water-soluble material in combination, has a excellent suitability for development by water.

In the printing plate element in which the foregoing materials are used in combination in the image forming layer, the area exposed to infra-red laser light is changed to water-insoluble without ablation, and the non exposed area is rapidly dissolved in water. Accordingly, the development by water can be performed and no specific device and no exclusive developing solution are necessary. The resolving power is high since the image forming mechanism is not ablation. Moreover, an excellent effect can be obtained that the formation of scratches can be prevented since the image forming layer also has a function of water soluble protection layer.

The printing plate element according to the invention can be developed by setting the undeveloped plate on a printing machine and developing the plate by a wetting liquid. An on-press printing machine is preferably applied, on which the exposing to laser light and the developing by the wetting liquid are performed.

The image formation of the invention is characterized in that the layer A provided on the substrate contains the material 1 which is water-insoluble or capable of changing to water-insoluble at a temperature of not less than 60° C. and the material 2 which is water-soluble and crystalline and has a melting point within the range of from 60° to 300° C. in combination.

A type of the material 1 is a material 1*a* which is water-insoluble and has a melting point within the range of from 60 to 300° C. Another type of the material 1 is a water-soluble material 1*b* which is changed to water-insoluble by coagulation at a temperature of not less than 60° C.

When the material 1*a* is combined with the material 2, the material 2 gives a suitable water development property to the non-exposed area, and the material 1*a* is thermally fused together with the material 2 in the exposed area and aids the formation of the ink acceptable image area by the following mechanism.

When the material 1*b* is combined with the material 2, the material 2 gives a suitable water development property to the non-exposed area, and in the exposed area, the material 2 form a water-insoluble hybrid substance together with the material 1*b* accompanied with the material 1*b* accompanied with the coagulation of the material 1*b* to contribute to form the ink acceptable image area by the following mechanism.

When the material 1*a* and 1*b* and the material 2 are combined, a suitable water developability and the image formation ability can be obtained by the mixed mechanism of the above-mentioned.

The height of the S/N ratio of solubility in water of the unexposed area/infra-red exposed area is inherent property of the combination of the material 1 and the material 2 according to the invention.

The invention is described in detail below.

(1) Printing Plate Element

The printing plate element of the invention is characterized in that the element comprises a substrate having thereon the layer A containing the material 1 which is water-insoluble or capable of changing from water-soluble to water-insoluble at a temperature of not less than 60° C. and the material 2 which is water-insoluble and crystalline and has a melting point of from 60 to 300° C. The layer A is preferably formed on the substrate as a continuous layer.

Herein, the expression "a material is crystalline" means that when the material is subjected to measurement by a differential scanning calorimeter, an endothermic peak on the curve obtained in the measurement, exhibiting a melting point portion is within the range of ±10° C., preferably ±5° C., and more preferably ±2° C. of the melting point.

It is preferable to arrange a hydrophilic layer B between the substrate and the layer A provided on the substrate. By such the way, the printing plate element can be improved so as to have a suitability to a heat mode recording with an excellent resistivity to the formation of stain and scratches. The hydrophilicity of the hydrophilic layer B of the invention means that the acceptability to water is stronger than that to ink, in another words the ink is difficultly adhered.

The printing plate element according to the invention preferably contains a light-heat conversion material such as later-mentioned in the substrate or at least one of the layers thereof. Although the light-heat conversion material is preferably contained in the hydrophilic layer B, the printing plate element may have a layer C containing the light-heat conversion material, and may have any form.

Examples of the structure of the printing plate element according to the invention include the followings. Another layer such as a subbing layer or a backing layer may be added to the following structures.

Light-heat conversion material containing layer A/Hydrophilic substrate

Layer A/Light-heat conversion material containing hydrophilic layer B/Substrate

Layer A/Hydrophilic layer B/ Light-heat conversion material containing layer C/Substrate Layer A/ Light-heat conversion material containing layer B/Light-heat conversion material containing layer C/Substrate

Layer A

The layer A contains the material 1 which is water-soluble or capable of changing from water-soluble to water-insoluble at a temperature of not less than 60° C. and the material 2 which is water-soluble and crystalline and has a melting point within the range of from 60 to 300° C.

The preferred thickness of each layer is as follows. The thickness of layer A (first component layer) is preferably 0.05 to 5 μm, and more preferably 0.1 to 3 μm. The total thickness of the hydrophilic layer B (second component layer) and layer C (third component layer) is preferably 0.1 to 30 μm, and more preferably 0.5 to 10 μm. In cases where recording is performed in an ink-jet system, the thickness of the hydrophilic layer B is preferably 0.5 to 50 μm.

In the invention, "water-insoluble" means one having a solubility, weight in gram of the material dissolvable in 100 g of water, of less than 0.1, and "water-soluble" means one having a solubility of not less than 0.1.

The content of the material 1, the total content of the materials 1*a* and 1*b* when both of them are contained, in the layer A is from 1 to 99%, preferably from 20 to 90%, more preferably from 30 to 80%, of the whole weight of the layer A.

The content of the material 2 is from 1 to 99%, preferably from 10 to 80%, of the whole weight of the layer A. The ratio of the material 1 to the material 2 is preferably from 1:0.1 to 1:10, more preferably 1:0.3 to 1:4.

Material 1

The preferable material 1 to be contained in the layer A includes the material 1*a* which is water insoluble and has a melting point within the range of from 60 to 300° C. and the material 1*b* which is water-soluble at room temperature and is variable to be water-insoluble at a temperature of not less than 60° C.

Material 1*a*

Materials generally classified into wax. The material preferably has a softening point of from 40° C. to 120° C. and a melting point of from 60° C. to 150° C., more preferably a softening point of from 40° C. to 100° C. and a melting point of from 60° C. to 120° C. The melting point of 60 to 300° C., which improves storage stability and enhances ink adhesion sensitivity, is preferred.

Material usable as the material 1*a* include a paraffin, a polyolefin, a polyethylene wax, a microcrystalline wax and a fatty acid wax. The molecular weights of them are approximately from 800 to 10,000. A polar group such as hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a iodine-modified phenol resin, a terpene-modified phenol resin, a xylene resin, a ketone resin, an acryl resin, an ionomer and a copolymer of such the resins may also be usable.

Among them, polyethylene, microcrystalline wax, fatty acid ester and fatty acid are preferably contained. A high sensitive image formation can be performed since these materials each have a relative low melting point and a low viscosity in the molten state. These materials each have a lubrication ability. Accordingly, damage on the layer A when a shearing force is applied to the surface of the layer A, and the resistivity to the printing contamination caused by scratch is further enhanced.

It is preferable that the material 1*a* has a particle shape in the layer A, and that that the material A is dispersible in water. The average particle size is preferably from 0.01 to 10 μm, more preferably from 0.1 to 3 μm. The average particle size of material 1*a* of 0.01 to 10 μm achieves sufficient development with water and prevents occurrence of background staining, leading to superior sharpness.

The composition of the particle-shaped material 1 may be continuously varied from the interior to the surface of the particle. The particle may be covered by a different material.

Known microcapsle production method or sol-gel method can be applied for covering the particle.

Material 1*b*

A water-soluble protein and a water-soluble glycoprotein are preferably usable as the material 1*b*. Examples of them include ovalbumin, casein, soy bean protein, a synthesized protein and a protein synthesized by genetic engineering. Among them ovalbumin is preferable. The modification or viscosity increasing, of ovalbumin is started at approximately 58° C., and the modification is completed to coagulated at approximately 80° C.

Ovalbumin is frequently supplied in a form of powder. In some cases, a part or whole of sugar in a state of free or combined in the albumin is removed at the time of powdering for preventing change of color during the storage of the powder. Such the albumin from which a part or the whole of sugar has been removed is also preferably usable in the invention.

The water-soluble protein and the water-soluble glycoprotein may be modified for improving the storage ability, stabilizing the control of sensitivity (including raising the modification temperature). Known method can be applied for the modification. In concrete, the protein can be stabilized by increasing the force affecting to stabilize the steric structure of the protein or removing the strain applied on the native structure of the protein. Besides, an equilibrium stable state can be obtained by making the denatured state to further labile. The means for stabilization is as follows.

A. Making the native state further stable

Enhancement of hydrophobicity

Enhancement of static interactive effect

Enhancement of hydrogen bond

Enhancement of portion of ligand bonding such as metal

B. Removing the strain on the native structure

Removing of undesirable electric charge

Releasing the abnormal bonding angle

Removing of cavity

Changing of exposed hydrophobic group

C. Unstabilization of denatured state

Introduction of crosslinking

Changing of side chain to proline

Changing of glycine to another side chain

D. Others

Coating with a sugar chain or a synthetic macromolecule

Fixation

Polymerization

Material 2

As the material 2, an oligosaccharide is preferable, although any material is usable as long as the material satisfies the requirement that the material is water-soluble and crystalline and has a melting point within the range of from 60 to 300° C. The development by water can be rapidly performed since the oligosaccharide has a suitable dissolving ability in water.

The oligosaccharide is a water-soluble crystalline substance generally having a sweet taste, which is formed by a dehydrating condensation reaction of plural sugar molecules. The oligosaccharide is one kind of o-glycoside formed by sugar as the aglycon. The oligosaccharide is easily hydrolyzed by an acid to form a monosaccharide, and is classified according to the number of the monosaccharide molecule, for example, to disaccharide, trisaccharide, tetrasaccharide, and pentasscharide. In the invention, the oligosaccharide includes from di- to undeca-saccharide.

The oligosaccharide is classified into a reducing oligosaccharide and a non-reducing oligosaccharide according to the existence of a reducing group. The oligosaccharide is also classified into a homo-oligosaccharide composed of the same kind of monosaccharide and a hetero-oligosaccharide composed of two or more kinds of monosaccharide.

The oligosaccharide naturally exists in a free states or a glycoside state. Moreover, various oligosaccharides are formed by a glycosyl transition by an enzyme.

The oligosaccharide frequently exists in a hydrated state in an ordinary atmosphere. The melting point of the hydrated compound and that of the dehydrated compound are different from each other as shown in the following Table 1.

TABLE 1

| Kind of oligosaccharide | Melting point (° C.) Hydrated compound | Melting point (° C.) Dehydrated compound |
|---|---|---|
| Raffinose (Trisaccharide) | 80 (Pentahydrate) | 118 |
| Trehalose (Disaccharide) | 97 (Dihydrate) | 215 |
| Maltose (Disaccharide) | 103 (Monohydrate) | 108 |
| Galactose (Disaccharide) | 119 (Monohydrate) | 167 |
| Lactose (Disaccharide) | None | 182 |

TABLE 1-continued

| Kind of oligosaccharide | Melting point (° C.) Hydrated compound | Melting point (° C.) Dehydrated compound |
|---|---|---|
| Sucrose (Disaccharide) | 201 | 252 |

It seems in the layer A that the melting of the oligosaccharide is the melting point of the hydrated compound when the oligossccharide is one capable of forming a hydrated compound.

Among the oligosaccharides, a reduction sugar such as maltose is excellent for the raising the strength of the image area and the visible image formation property since such an oligosaccharide forms a color by Maillard reaction with a protein or a amino acid. The use of the non reduction sugar such as trehalose is suitable for raising the storage ability since such the sugar has a low hygroscopicity and a high inhibiting effect on the modification of protein. Trehalose is particularly excellent for formation of a high contrast image with a high sensitivity. Moreover, the hygroscopicity is very low and both of the developability by water and the storage ability are very high even though the solubility in water is very high.

When a hydrated oligosaccharide is molten by heating for dehydration and solidification, a crystal of the dehydrated compound is formed within a short period after the solidification. In the case of trehalose, it is noticed that the melting point of the dehydrated compound is higher 100° C. or more than that of the hydrated compound. Such the phenomenon means that the exposed area is changed into a state-difficultly molten just after the solidification following the melting by the infrared exposure. Consequently, an image defect such as that caused by banding at the time of exposure is difficultly occurred. Trehalose is particularly preferred among the oligosaccharides to attain the object of the invention.

It is considered that such the sugars are each made water-insoluble by bonding with the protein or the glycoprotein accompanied with the modification of the protein or the glycoprotein by heating or an acid. In the non-image area, at which the modification of the protein or the glycoprotein is not occurred, the presence of sugar or its derivative accelerates the dissolution of the layer A, and raises the rapidity of the start, S/N ratio of image area/non-image area at the initial time of the printing, of the printing.

The content of the sugar in the layer A is preferably from 1 to 400%, more preferably from 20 to 200%, further preferably from 60 to 160%, by weight of the whole weight of the protein and/or glycoprotein in the Layer A. The effect of the sugar is not observed when the content is less than 1% by weight, and the sensitivity of the coagulation of the layer A is lowered when the content is more than 400% by weight.

The combination effect of the material 1 and the material 2 is described below.

Combination Effect of Material 1 and 2

Basically, the water-insoluble ink acceptableimage is formed by the following process: the material 1*a* in the layer A is thermally molten and contacted with the hydrophilic surface just under the layer A, or permeated into the fine opening of the porous hydrophilic layer, and solidified and fixed accompanied with lowering of the temperature. The water development is made possible by the material 2, and the material 2 itself is also thermally molten, and moved and fixed on the hydrophilic surface just under the layer A or permeated into the interior of the porous hydrophilic layer. The material 2 has a sharp melting point since it is crystalline. Accordingly a high contrast image can be obtained. The material 2 has a low hygroscopicity and the properties of the plate element is not degraded in the period storage at a high temperature. The material 2 shows an effect of inhibiting the scratch formation caused by the ordinary handling since the material is in a solid crystalline state.

It is preferable that the melting point of the material 2 is higher than that of the material 1*a*. In such the situation, the material 1*a* is sufficiently molten at the time of melting of the material 2 is started. At this time, the material 1 is more easily moved compared with the material 2. Accordingly, a high resolved image can be formed since the material 1 can be moved and fixed prior to the material 2 to the hydrophilic surface just under the layer A or permeated into the interior of the hydrophilic layer. The difference of the melting point of the material 1*a* and that of the material 2 is preferably from 0.1 to 150° C., more preferably from 10 to 100° C., and further preferably from 15 to 100° C. The difference of the melting point is (melting point of material 2–that of the material 1*a*), in which the melting point is the center value of the distribution of the melting point of each materials. The melting point of the material 1*a* is preferably from 50 to 150° C. In such the case, the balance of the sensitivity and the storage ability is suitable. The melting point within the range of from 60 to 120° C. is more preferable since the balance of the sensitivity and the storage ability is further improved.

It is preferable that the material 1*a* has a shape of particle, and the average diameter of the particle is from 0.01 to 10 μm, more preferably from 0.1 to 3 μm. It is preferable that the material 1*a* is existed in the layer A in a form of enveloped in the material 2, in other words, the material 2 forms a continuous phase and the material 1*a* forms a discontinuous phase. It is preferable that the material 1*a* is enveloped in the material 2 so that the material 1*a* is substantially not contacted directly with the hydrophilic surface just under the layer A.

In such the situation, the property of the water-soluble material 2 is strongly appeared in the property of the layer A so that the water-developability of the layer A is considerably improved. No stain is occurred even when a perpendicular stress or a shearing force is applied to the surface of the layer A so that a part of the layer A is destroyed and the material 1*a* is rubbed against to the surface of the non-image area since the material 2 is always existed between the hydrophilic layer surface just under the layer A and the material 1*b* and the scrubbed material 1*a* is removed by the development by water.

The average particle size of material 1*a* of 0.01 to 10 μm achieves sufficient development with water and prevents occurrence of background staining.

When the average diameter is within the range of from 0.1 to 3 μm, excellent sensitivity and resolving power can be obtained.

Combination Effect of the Materials 1*b* and 2

The material 1*b* such as the water-soluble protein and water-soluble glycoprotein can form an image by thermal coagulation itself. However, the water-developability, one of the objects of the invention, cannot be satisfied by the singly use of the protein or glycoprotein. The dissolving ability of the protein and the glycoprotein can be accelerated by the combination with the material 2 so that the suitable water-developability can be attained.

Among the material 2, the use of the oligosaccharide inhibits the modification of the protein and the glycoprotein in the layer A and gives a suitable storage ability. Moreover, the use of the oligosaccharide is preferable since the use of the oligosaccharide does not cause any lowering of the sensitivity and the image strength because the oligosaccharide is made water-insoluble by forming a hybrid substance together with the protein by salt bonding accompanied with the thermal modification of the protein in the exposed area.

Another Material which may be Added

Macromolecular Polymer Particle

A thermoplastic hydrophobic macromolecular polymer particle is usable. Although there is no specific limitation on the softening point of the thermoplastic hydrophobic polymer particle, the softening point is preferably lower than the decomposition temperature of the polymer particle. The weight average molecular weight (Mw) of the polymer is preferably within the range of from 10,000 to 1,000,000.

Concrete examples of the polymer consisting the fine polymer particle include a diene (co)polymer such as a polypropylene, a polybutadiene, a polyisoprene and an ethylene-butadiene copolymer, a synthesized rubber such as a styrene-butadiene copolymer, a methyl methacrylate-butadiene copolymer and an acrylonitrile-butadiene copolymer, a (metha)acrylic acid (co)polymer, a vinyl ester (co)polymer such as a polyvinyl acetate), a vinyl acetate-vinyl propionate copolymer and a vinyl acetate-ethylene copolymer, a vinyl acetate-(2-hexylethyl acrylate copolymer, poly(vinyl chloride), poly(vinylidene chloride), a polystyrene and a copolymer thereof. Among them, the (metha)acrylate polymer, the (metha)acrylic acid (co) polymer, the vinyl ester (co)polymer, the polystyrene and the synthetic rubbers are preferably used.

The polymer fine particle may be made from a polymer synthesized by any known method such as an emulsion polymerization method, a suspension polymerization method, a solution polymerization method and a gas phase polymerization method. The fine particle of the macromolecular polymer synthesized by the solution polymerization method or the gas phase polymerization method can be produced by a method by which an organic solution of the polymer is sprayed in to an inactive gas and dried, and a method by which the polymer is dissolved in a water-immiscible solvent, then the solution is dispersed in water or an aqueous medium and the solvent is removed by distillation. In both of the methods, a surfactant such as sodium lauryl sulfate, sodium dodecylbenzenesulfate and polyethylene glycol, and a water-soluble resin such as poly(vinyl alcohol) may be used as a dispersing agent or stabilizing agent according to necessity.

The polymer fine particle is preferably used in a form of dispersion comprising a medium and the polymer fine particles dispersed therein and the dispersion is preferably an aqueous dispersion.

The particle diameter of the polymer particle is preferably within the range of from 0.005 to 2 μm, the amount thereof contained in the layer A is preferably from 1 to 50%, more preferably from 10 to 40%, by weight of the whole weight of the layer A.

Lubricant

A water-soluble surfactant is usable. A silicon-containing or a fluorine-containing surfactant is preferably used. The adding amount the surfactant is preferably from 0.01 to 5%, more preferably from 0.1 to 3%, by weight of the whole weight of the layer A.

Matting Agent

An inorganic and organic particle may be used. An ordinary metal oxide particle such as silica, aluminosilicate, titania and zirconia may be used as the inorganic particle. A porous particle having an apparent specific gravity of not more than 1.5 is preferred for preventing the precipitation of the particle in the coating liquid in which the particle is added and dispersed. The sphere particle is preferable. Examples of such the porous particle include the later-mentioned porous silica particle and porous aluminosilicate particle.

A crosslinked resin particle such as a particle of Nylon, PMMA, silicone, Teflon, polyethylene and polystyrene are usable as the organic particle. A polysaccharide particle is usable, which is produced by water-insolubilizing the polysaccharide such as mannose, purulan, alginic acid, dextrin, glucomannan, starch, guar gum and a sugar derivative by a crosslinking agent such as a polyvalent metal ion, a crosslinking agent that having a glycidyl group and a crosslinking agent containing formalin. These particle may be prepared in advance as an aqueous dispersion, and any surfactant may be contained in the dispersion.

Among these particles, the porous particle and the polysaccharide particle are preferable from the viewpoint of dispersibility in an aqueous coating liquid and the hydrophilicity of the particle.

The porous polysaccharide particle described in JP O.P.I. 10-297078 is usable as the polysaccharide particle. A particle of polyvalent metal salt of arginic acid is particularly preferred, which is argininc acid cross-linked by a polyvalent metal ion.

Water-soluble Resin

Examples of the water-soluble resin include a poly(vinyl alcohol), a silyl-modified poly(vinyl alcohol), a cation-modified poly(vinyl alcohol), a cellulose derivative such as a methyl cellulose, a carboxymethyl cellulose and a hydroxyethyl cellulose, a polysaccharide such as an alginate and puluran, a polyethylene oxide, a polyethylene glycol (PEG), a polyvinyl ether and polyvinylpyrrolidone.

A cationic resin may be contained in the layer. Examples of the cationic resin include a polyalkylene-polyamine or its derivative such as a polyethylenediamine and a polypropylene-polyamine, a an acryl resin having a tertiary amino group or a quaternary ammonium group and diacrylamine. The cationic resin may be added in a form of a fine particle. Example of such the case is the cationic micro gel described in JP O.P.I. No. 6-161101.

A crosslinking agent may be added to the layer. Examples of the crosslinking agent include a melamine resin, an isocyanate compound, an isooxazole compound, an aldehyde compound, an N-methylol compound, a dioxane derivative, a reactive vinyl compound and a reactive halogen compound.

Hydrophilic Layer B

The hydrophilic layer B is arranged between the substrate and the layer A and exhibits hydrophilicity. In other words, the layer B selectively accepts water than ink at the time of printing using a wetting liquid. The hydrophilic layer B is preferably porous. The porosity of the layer can be obtained by containing a porosity providing material such as a necklace-shaped colloidal silica or a porous particle. It is preferable that the layer contains the later-mentioned light-heat conversion material.

A preferable embodiment of the hydrophilic layer B is one which contains an alkaline colloidal silica and the water-soluble polysaccharide and has an uneven protruding surface structure having a pitch (i.e., the distance of peak to peak) of from 0.1 to 50 $\mu$m.

The later-mentioned necklace-shaped colloidal silica is preferably contained in the layer as the alkaline colloidal silica, and the average diameter of the colloidal silica is particularly preferably not more than 100 nm.

It has been found that a suitable hydrophilic layer can be obtained when the hydrophilic layer B is formed by an alkaline coating liquid, although the mechanism cannot be specified. Such the layer does not cause the background contamination when a lot of number of prints is printed.

The surface of the hydrophilic layer B preferably has a uneven structure having a pitch of from 0.1 to 50 $\mu$m such as the ground surface of the aluminum PS plate. The water holding ability and the image maintaining ability is raised by the unevenness of the surface.

The uneven structure is preferably formed by coating a coating liquid of the hydrophilic layer B containing the alkaline colloidal silica and the water-soluble polysaccharide so that the phase separation is occurred at the time of drying the coated liquid, even though such the structure can also be formed by adding a filler having a suitable particle diameter to the coating liquid of the hydrophilic layer B.

The shape of the uneven structure such as the pitch and the surface roughness thereof can be suitably controlled by the kind and the adding amount of the alkaline colloidal silica, the kind and the adding amount of the water-soluble polysaccharide, the kind and the adding amount of another additive, the solid concentration of the coating liquid, the wet layer thickness and the drying condition.

The pitch of the uneven structure is preferably from 0.2 to 30 $\mu$m, more preferably from 0.5 to 30 $\mu$m. A double uneven structure may be formed, in which an uneven structure having a smaller pitch is formed on an uneven structure having a larger pitch.

The roughness of the surface is preferably from 100 to 1,000 nm, more preferably from 150 to 600 nm, in Ra value.

Porosity Providing Material

The following a to c are preferably usable as the porosity providing material. The use of the necklace-shaped colloidal silica is particularly preferred. Plural kinds of the porosity providing material simultaneously can be used.

a. Necklace-shaped Colloidal Silica

The necklace-shaped colloidal silica is preferably used as the porosity providing material since the strength of the layer can be held while the porosity of the layer is maintained by the addition of the necklace-shaped colloidal silica.

The necklace-shaped colloidal silica to be used in the invention is a generic term of an aqueous dispersion system of a spherical silica having a primary particle diameter of the order of nm. The necklace-shaped colloidal silica to be used in the invention means a "pearl necklace-shaped" colloidal silica formed by connecting colloidal silica particles each having a primary particle diameter of from 10 to 50 $\mu$m so as to attain a length of from 50 to 400 nm. The term of "pearl necklace-shaped" means the image of the connected colloidal silica particles is like to the shape of a pearl necklace. The pearl necklace shape is described according to figures.

Figure 2:
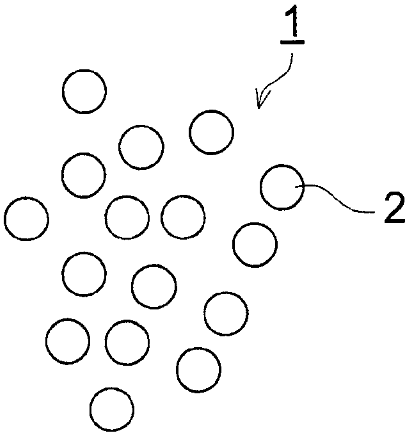
FIG. 2 shows a schematic illustration of an example of dispersion structure of conventional colloidal silica.

FIG. 2 schematically shows the dispersion structure of an ordinary colloidal silica. As shown in FIG. 2, the ordinary colloidal silica 1 is a dispersion system of spherical silica particle 2. In contrast, FIG. 1 is a scheme showing an example of the dispersion structure of the necklace-shaped colloidal silica to be used in the invention. As is shown in FIG. 1, the necklace-shaped colloidal silica 3 is a dispersion system in which spherical silica particles 4 are dispersed in ac connected state. It is deduced that the bonding between the silica particles forming the necklace-shaped colloidal silica is a —Si—O—Si— bonding which is formed by a dehydration bonding of —SiOH groups existed on the surface of the silica particles. Concrete example of the necklace-shaped colloidal silica includes "Snowtex-PS" series produced by Nissan Kagaku Kogyo, Co., Ltd.

The coating liquid of the hydrophilic layer B is preferably alkaline. The examples of commercial name of the alkaline colloidal silica include Snowtex-PS-S (the average particle diameter in the connected state is approximately 110 nm), Snowtex-PS-M (the average particle diameter in the connected state is approximately 120 nm) and Snowtex-PS-L (the average particle diameter in the connected state is approximately 170 nm). Acidic colloidal silica corresponding to each of the above-mentioned are Snowtex-PS-S-O, Snowtex-PS-M-O and Snowtex-PS-L-O, respectively. Among them, the use of Snowtex-PS-S, Snowtex-PS-M or Snowtex-PS-L is particularly preferable since the occurrence of background contamination is inhibited even when a lot of prints is printed.

The alkaline necklace-shaped colloidal silica can be used in the hydrophilic layer having the uneven structure with a pitch of from 0.1 to 50 $\mu$m which is an embodiment of the invention.

It is preferable to use the alkaline necklace-shaped colloidal silica for preventing the occurrence of the background contamination when a lot of prints is printed.

b. Porous Silica or Porous Aluminosilicate Particle

A porous silica particle or a porous aluminosilicate particle may be added as an additive to the hydrophilic layer.

The porous silica particle is ordinary produced by a wet method or a dry method. By the wet method, the porous silica particle can be obtained by drying and pulverizing a gel prepared by neutralizing an aqueous silicate solution, or pulverizing the precipitate formed by neutralization. By the dry method, the porous silica is prepared by combution of silicon tetrachloride together with hydrogen and oxygen to precipitate silica. The porosity and the particle diameter of such the particles can be controlled by the changing of the production conditions.

The porous silica particle prepared from the gel by the wet method is particularly preferred. For example, the porous aluminosilicate particle is prepared by the method described in JP O.P.I. No. 10-71764. Thus prepared aluminosilicate particle is an amorphous complex particle synthesized by hydrolysis of aluminum alkoxide and silicon alkoxide as the major components. The particle can be synthesized so that the ratio of alumina to silica in the particle is within the range of from 1:4 to 4:1. A complex particle composed of three or more components prepared by an addition of another metal alkoxide may also be used in the invention. In such the particle, the porosity and the particle diameter can be controlled by the adjustment of the producing conditions.

The porosity of the particle is preferably not less than 1.0 ml/g, more preferably not less than 1.2 ml/g, further preferably of from 1.8 to 2.5 ml/g, in the fine pore volume before the dispersion.

The pore volume is closely related to the water receptivity of the coated layer, and the water receptivity is increased so that staining tends to difficultly occurred, and the latitude of water amount is widened accompanied with increasing of the orifice volume. Specifically, the water receptivity of 1.0 to 2.5 ml/g prevents staining and enhances the water amount latitude and durability of the coated layer.

The preferable particle diameter is substantially not more than 1 $\mu$m, more preferably not more than 0.5 $\mu$m, in the state of contained in the hydrophilic layer (including the case in which the particle is subjected by the dispersing and pulverizing processes). When a coarse particle is existed, a porous and sharp projection is formed at the surface of the layer and ink tends to be remained around the projection. As a result of that the contamination at the non-image tends to be occurred.

c. Zeorite Particle

Zeorite is a crystalline aluminosilicate, which is a porous material having a regular three dimensional net work structure of orifice. Natural and synthesized zeorite are expressed by the following formula.

$$(M^1, M^2{}_{1/2})_m(Al_mSi_nO_2{}^{(m+n)}).xH_2O$$

In the above, $M^1$ and $M^2$ are each a exchangeable cation. Examples of $M^1$ include $Li^+$, $Na^+$, $K^+$, $Tl^+$, $Me_4N^+$ (TMA), $Et_4N^+$(TEA), $Pr_4N^+$ (TPA) and $C_7H_{15}N^{2+}$, and examples of $M^2$ include $Ca^{2+}$, $Mg^{2+}$, $Ba^{2+}$, $Sr^{2+}$ and $C_8H_{18}N^{2+}$. Relation of n and m is n=m. Consequently, the ratio of m/n or that of Al/Si is not more than 1. A high Al/Si ratio corresponding to a higher content of the exchangeable cation. Accordingly the polarity of the particle is raised and the hydrophilicity is also raised. The preferably Al/Si ratio is within the range of from 0.4 to 1.0, more preferably 0.8 to 1.0. x is an integer.

Synthesized zeorite having a stable Al/Si ratio and a sharp particle diameter distribution is preferably used as the zeorite particle to be used in the invention. Examples of such the zeorite include Zeorite A: $Na_{12}$ $(Al_{12}Si_{12}O_{48}).27H_2O$; Al/Si=1), Zeorite X: $Na_{86}(Al_{86}Si_{106}O_{384}).264H_2O$; Al/Si=0.811 and Zeorite Y: $Na_{56}(Al_{56}Si_{136}O_{384}).250H_2O$; Al/Si=0.412.

The hydrophilicity of the hydrophilic layer itself is considerably raised by containing the porous particles having an Al/Si ratio within the range of from 0.4 to 1.0 and a high hydrophilicity, and the contamination in the course of printing is inhibited and the occurrence of contamination caused a finger mark is also considerably inhibited. When Al/Si is less than 0.4, the hydrophilicity is insufficient and the above-mentioned improving effects is lowered.

The preferable particle diameter is substantially not more than 1 $\mu$m, more preferably not more than 0.5 $\mu$m, in the state of being contained in the hydrophilic layer (including the case in which the particle is subjected by the dispersing and pulverizing processes).

When a coarse particle is existed, a porous and sharp projection is formed at the surface of the layer and ink tends to be remained around the projection. As a result of that the occurrence of the contamination at the non-image area tends to be occurred.

Other than the above-mentioned, for example, a metal oxide particle having an average particle diameter of not less than 100 nm and an organic particle such as calcium alginate particle and crystallized cellulose particle may be used.

The content of such the porosity providing material is preferably from 30 to 95%, more preferably from 50 to 90%, by weight of the whole weight of the hydrophilic layer B.

Metal oxide fine particle having an average diameter of not more than 100 nm

The hydrophilic layer B may contain a metal oxide fine particle having an average diameter of not more than 100 nm. The metal oxide particle functions as an inorganic binder in the hydrophilic layer B. Examples of the metal oxide fine particle include a colloidal silica, an alumina sol, a titania sol and another metal oxide sol. The metal oxide fine particle may have any shape such as spherical, needle-like, and feather-like shape. The average particle diameter is preferably from 3 to 100 nm, and plural kinds of metal oxide each having a different diameter may be used with together. The surface of the particle may be subjected to a surface treatment.

The metal oxide fine particle can be used as a binder utilizing the layer forming ability thereof. The metal oxide fine particle is suitable to be used in the hydrophilic layer since the lowering of the hydrophilicity of the layer is smaller than the use of the organic binder. Among the above-mentioned, the colloidal silica is particularly preferred since the layer forming ability is high under a drying condition with a relative low temperature.

The binding force of the colloidal silica is become larger accompanied with the decreasing the diameter of the particle. The average diameter of the colloidal silica to be used in the invention is preferably from 1 to 50 nm, more preferably 3 to 20 nm. As above-mentioned, an alkaline colloidal silica shows an effect of inhibiting the occurrence of the background contamination. Accordingly, the use of the alkaline colloidal silica is particularly preferable.

Examples of alkaline colloidal silica having the average diameter within the foregoing preferable range include Snowtex-20 (average particle diameter: 10 to 20 nm), Snowtex-30 (average particle diameter: 10 to 20 nm), Snowtex-40 (average particle diameter: 10 to 20 nm), Snowtex-N (average particle diameter: 10 to 20 nm), Snowtex-S (average particle diameter: 8 to 11 nm) and Snowtex-XS (average particle diameter: 4 to 6 nm), each produced by Nissan Kagaku Co., Ltd.

The ratio of the foregoing porosity providing material to the metal oxide fine particles having an average diameter of not more than 100 nm is preferably from 95/5 to 5/95, more preferably from 80/20 to 20/80, further preferably from 70/30 to 30/70.

Water-soluble Polysaccharide

Starch and a derivative thereof, cellulose and a derivative thereof and a poly(uronic acid) are usable. Among them, a cellulose derivative such as a methyl cellulose salt, a carboxymethyl cellulose salt and a hydroxyethyl cellulose salt is preferable and sodium or ammonium salt of carboxymethyl cellulose is more preferable.

When such the cellulose derivative is dissolved in water together with the alkaline necklace-shaped colloidal silica or/and the colloidal silica having an average diameter of not more than 100 nm, a phase generation is accompanied with the increasing of the solid concentration caused by coating and drying so that the surface having the regular uneven structure can be formed.

The adding amount of the cellulose derivative is preferably from 0.1 to 10%, more preferably from 0.5 to 5% by weight to the whole weight of the solid components weight containing in the coating liquid. The uneven structure forming ability is not realized when the amount is less than 0.1% by weight, and the water resistivity of the dried layer is lowered when the amount is more than 10% by weight.

Other Usable Materials

Water-soluble Resin

Example of the water-soluble resin include a poly(vinyl alcohol), a silyl-modified poly(vinyl alcohol), a poly(ethylene oxide), a poly(propylene oxide), a poly(ethylene glycol) (PEG), a poly(vinyl ether), a styrene-butadiene copolymer, a conjugation diene polymer latex of methyl methacrylate-butadiene copolymer, an acryl polymer latex, a vinyl polymer latex, a polyacrylamide, and a polyvinylpyrrolidone. Among them, PEG is particularly preferred.

A cationic resin may also be contained in the layer. Examples of the cationic resin include a polyalkylenepolyamine or a derivative thereof such as a polyethyleneamine and polypropylenepolyamine, an acryl resin having a tertiary amino group or a quaternary ammonium group and diacrylamine. The cationic resin may be added in a form of fine particle. Example of such the particle is the cationic microgel described in JP O.P.I. No. 6-161101.

A crosslinking agent may be added into the layer. Examples of the crosslinking agent include a melamine resin, an isocyanate compound, an isooxazole compound, an aldehyde compound, an N-methylol compound, a dioxane compound, a reactive vinyl compound and a reactive halogen compound.

Matting Agent

The foregoing porous particles which is described as the material capable of being added to the layer A can also be usable to the hydrophilic layer B. Furthermore, an inorganic particle having a new Moh's hardness of not less than 5 may be added for raising the abrasion resistivity. Examples of the inorganic particle having a new Moh's hardness of not less than 5 include a non-porous metal oxide particle such as a particle of silica, alumina, titania, zirconia, iron oxide and chromium oxide, a particle of metal carbide such as silicon carbide, boron nitride powder and diamond powder. The particle having no sharpened corner, for example, a particle near spherical such as a molten silica particle and shirasu-baloon particle, is preferred.

The specific surface area as the indicator of the non-porosity is preferably not more than 50 $m^2/g$, more preferably not more than 10 $m^2/g$, in a BET value.

The average particle diameter is preferably from 1 to 2, more preferably from 1.1 to 1.5, times of the thickness of the hydrophilic layer B. It is preferable that the particles has a sharp size distribution, and that the diameters of the particles of not less than 60% of the whole particles are included within the range of from 0.8 to 1.2 times of the average particle diameter. Moreover, it is preferable that the ratio of the particles having a diameter of 2 times of the average diameter is not more than 5%.

The content of the inorganic particle having a new Moh's hardness of not less than 5 is preferably from 0.1 to 20%, more preferably from 0.5 to 10%, by weight of the whole weight of the hydrophilic layer B.

Layer Structural Mineral Particle

A layer structural mineral particle may be contained in the hydrophilic layer B. Examples of the layer structural mineral particle include a clayey mineral such as kaolinite, halloysite, talk, smectite such as mommolinite, beidellite, hectorite and saponite, vermiculite, mica and chlorite, hydrotalcite and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral having such the charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral such as a pillared crystal, one treated by an ion exchange treatment or surface treatment such as a silane coupling treatment and a complication treatment with an organic binder, are also usable.

The size of the flat plate-shaped layer structural mineral particle is preferably not more than 20 μm, more preferably not more than 10 μm, in an average of the diameter (the largest length), and the average aspect ratio (the largest length of particle/the thickness of particle) is preferably not less than 20, more preferably not less than 50, in a state of contained in the layer including the case of that the particle is subjected to a swelling process and a dispersing layer-separation process. When the particle size is within the foregoing range, continuity to the parallel direction, which is a trait of the layer structural particle, and softness, are given to the coated layer so that a strong coated layer in which a lack is difficult formed can be obtained. When the particle size is outside the foregoing range, the scratch inhibiting effect is lowered in some cases. The scratch inhibiting effect tends also to be lowered when the aspect ratio is lower than the foregoing range since the softness of the layer is become insufficient.

The content of the layer structural mineral particle is preferably from 1 to 95%, more preferably from 3 to 80%, by weight to the total weight of the layer. Particularly, the addition of the swellable synthesized fluorinated mica is effective if the adding amount is small since the particle thereof is extremely thin. The layer structural mineral particle may be added after the treatment by the later-mentioned dispersing layer-separation process and swelling process.

Light-heat Conversion Material

A material having an ability of converting infrared rays to heat, namely one having an absorption band within the near infrared to infrared region. The infrared region is a wavelength of not less than 700 nm, preferably 750 nm. The material absorbing a wavelength of not less than 750 nm is particularly preferred for the CTP to be exposed by an infrared laser.

Examples of the light-heat conversion material include a ordinary infrared absorbing dye such as a cyanine dye, a chloconium dye, a polymethine dye, azurenium dye, a squalium dye, a thiopyrilium dye, a naphthoquinone dye and an anthraquinone dye, and an organic metal complex such as a phthalocyanine compound, a naphthalocyanine compound, an azo compound, a thioamide compound, a dithiol compound and an indoaniline compound. In concrete, the compounds described in JP O.P.I. Nos. 63-139191, 64-33547, 1-160683, 1-280250, 1-293342, 2-2074, 3-26593, 3-30991, 3-34891, 3-36093, 3-36094, 3-36095, 3-42281, 3-97589 and 3-103476. These compound may be used singly or in combination.

When the layer containing the light-heat conversion material is coated in a form of aqueous coating liquid, the use of a water-soluble dye provides a high light-heat conversion efficiency since such the dye can be uniformly dispersed in the layer without coagulation of the dye. Besides, it is preferably that a water-insoluble dye is uniformly dispersed in a form of fine particle having an average diameter of not more than 1 μm, more preferably not more than 0.5 μm.

The adding amount of the dye is preferably from 0.1 to 10%, more preferably from 1 to 5%, by weight to the total weight of the layer.

Among the light-heat conversion material absorbing infrared rays, one having it self an electric conductivity is preferred, and a semiconductor is also usable. Examples of such the material include a metal, carbon, graphite and an electroconductive metal oxide. As the metal any metal can be used as long as the metal is in a form of fine particle having preferably a particle diameter of not more than 0.5 μm, more preferably not more than 100 nm, further preferably not more than 50 nm. The metal particle may have any shape such as spherical, flaky and needle-like. A colloid metal particle such as that of silver or gold, is particularly preferred.

Furnace black and acetylene black is preferably used as the carbon. The graininess (d50) thereof is preferably not more than 100 nm, more preferably not more than 50 nm. It is preferable that the electroconductivity index represented by the following equation is not less than 30, more preferably not less than 50.

$$\text{Electroconductive index}=(\text{Specific surface area } m^2/g \times \text{DBP oil absorbance ml}/100\ g)^{1/2}/(1+\text{volatile content})$$

As to the graphite, a fine particle having preferably an average diameter of not more than 0.5 μm, more preferably not more than 100 nm, further preferably not more than 50 nm, is usable.

The fine particle of carbon or graphite is preferably used in a form of preliminary prepared aqueous dispersion since such the materials are difficult to be dispersed in the coating liquid. The aqueous dispersion may contains a dispersing agent other than the carbon or the graphite. It is preferable that the aqueous dispersion is preliminary adjusted at a alkaline since the coating liquid of the hydrophilic layer B is preferably alkaline. For example, Hitasol series produced by Hitachi Funmatsu Yakin Co., Ltd. is preferable which is an alkaline aqueous dispersion of graphite.

Examples of the conductive and semi-conductive metal oxide include Sb-doped $SnO_2$ (ATO), Sn-added $In_2O_3$ (ITO), $TiO_2$, TiO prepared by reducing $TiO_2$ (titanium oxide nitride, generally titanium black). A particle prepared by covering a core material such as $BaSO_4$, $TiO_2$, $9Al_2O_3.2B_2O$ and $K_2O.nTiO_2$ with such the metal oxide is usable. The particle diameter thereof is preferably not more than 0.5 μm, more preferably not more than 100 nm, further preferably not more than 50 nm. Among them, the titanium black is particularly preferred.

The foregoing light-heat conversion material may be contained in any layer formed on the substrate. Two or more light-heat conversion materials may be used in combination. When the light-heat conversion material is added into the layer A, the light-heat conversion material having a little color of the visible light or substantially white or transparent is preferably used to prevent the smudging of printing machine caused when the non-image area of the layer A is removed by dissolving on the printing machine.

The dispersing degree of the light-heat conversion material is closely related to the light-heat converting efficiency. Increasing of dispersion degree raises the amount of generated heat per the amount of the light-heat conversion material, and a high sensitivity can be attained by a smaller amount of the light-heat conversion material.

Ordinary kneading and dispersion methods can be applied for dispersing the light-heat conversion material, and a dispersing agent may be added. The light-heat conversion material can be used in a form of thin layer covering a core material. Ordinary microcapsule forming method can be applied for the covering. For example, the various methods described in T. Kondo and M. Koishi "Microcapsule—Its Producing method, Properties and Application" (1985, Sankyo Shuppan Co., Ltd.) or those described in the publications referred in the above publication can be applied. However, the method is not limited thereto. Among them the following methods are suitable.

a. Spray Drying Method

A dispersion comprising a solvent and the light-heat conversion material dispersed in the solvent is prepared. The binder and the solvent can be optionally selected. An ordinary kneading and dispersing method can be applied for the dispersing process. Such the process can be performed with a high efficiency since the process is only for dispersing the covering composition. Moreover, the process has an advantage that the optional binder and solvent can be used other than those necessary for realizing the function of the layer. For example, the covered particle to be added to a coating layer composed of a solvent system can be prepared in an aqueous dispersion system. The core particles are uniformly suspended in the dispersion liquid and thus prepared suspension is sprayed and dried to prepare the covered particle. Such the process can be performed, for example, by the use of an ordinarily used spray-dry granule producing apparatus.

The concentration of the light-heat conversion material dispersion is preferably from 0.1 to 10% by weight and the suspending concentration of the core particle is preferably from 10 to 50% by weight.

b. Dry Method

This method is a method for fixing the covering material onto the surface of the core particle by an electrostatic force or a physical encroaching. In this method, it is preferable that the core particle is not broken by the physical impact. Therefore, such the method is suitable when an organic core particle such as Nylon, PMMA, silicone and Teflon is used as the core particle.

The covering can be performed by using a dispersing apparatus such as a sand grinder and a ball mill.

The use of an apparatus utilizing a high speed air stream impact methods without using dispersing beads such as Hybridizer, manufactured by Nara Kikai Seisakusho, Co., Ltd., is preferable since the covered particles can be easily recovered. The covering treatment is performed, for example, for a time of from 5 to 60 minutes at a rotation number of from 300 to 2,000 r.p.m. when dispersing beads such as glass beads or ceramic beads are used.

When Hybridizer is used, the covering is performed at a circumference speed of from 50 to 150 m/second and for a time of from 1 to 20 minutes.

Generally, it is difficult to uniformly disperse the titanium black in the coating liquid and a pre-dispersion treatment such as kneading. However, a covered particle with the titanium black is easily dispersed. Accordingly, the light-heat converting layer in which the titanium black is effectively and highly dispersed can be formed. The particle covered by the titanium black can be prepared by the titanium black is dispersed by the dry method together with the organic particle such as that of PMMA, Teflon and calcium alginate, having a diameter of certain micrometers for thinly fixing/covering the core particle surface with the titanium black by the physical encroaching or the electrostatic force.

When the light-heat conversion material is added to the hydrophilic layer B, the use of the graphite or the electroconductive metal oxide are particularly preferred among the foregoing materials. The graphite almost does not cause lowering of the hydrophilicity accompanied with increasing of the additional amount. The addition of the electroconductive metal oxide increases the polar composition in the hydrophilic layer and causes raising of the hydrophilicity of the layer since the conductive metal oxide itself has a polarity.

The content of the light-heat conversion material is from 0 to 30%, preferably from 1 to 20%, more The preferably from 3 to 15% by weight to the whole weight of the layer.

Material 1

The material 1 also may be contained in the hydrophilic layer B. A function assisting the image formation by the layer A can be given by the addition of the material 1 into the hydrophilic layer B.

The adding amount of the material 1 is preferably from 0 to 30%, more preferably from 1 to 15%, by weight. The image formation assistance function is become larger accompanied with the increasing of the added amount. However, anxiety of occurrence of the background contamination in the course of a lot of prints is raised when the added amount of the material 1 is more than 30% by weight.

Material 2

The material 2 may be added also to the hydrophilic layer B. The contamination of the blanket can be reduced the addition of the material B.

The adding amount of the material 2 is preferably from 0 to 10%, more preferably from 1 to 5%, by weight. The water resistivity of the hydrophilic layer B is lowered when the amount of the material 2 is exceeds 10% by weight.

Silicate Aqueous Solution as Binder

An aqueous solution of a silicate is also usable as the binder to be added into the hydrophilic layer. An alkali metal silicate such as sodium silicate, potassium silicate and lithium silicate are preferable, and the $SiO_2/M_2O$ is preferably selected so that the pH value of the coating liquid after addition of the silicate is within the range of not more than 13 for preventing the dissolution of the inorganic particles.

Inorganic or Organic-inorganic Hybrid Polymer by Sol-gel Method as Binder

An inorganic polymer or an inorganic-organic hybrid polymer prepared by a sol-gel method can be used as a binder to be added to the hydrophilic layer. Known methods described in S. Sakka "Application of Sol-Gel Method" or in the publications referred in the above publication can be applied to prepare the inorganic polymer or the inorganic-organic hybrid polymer by the sol-gel method.

Surfactant

A water-soluble surfactant may be added for improving the coating ability of the coating liquid. A silicone type surfactant and a fluorinated surfactant are preferably used. The content of the surfactant is preferably from 0.01 to 3%, more preferably from 0.03 to 1%, by weight to the total weight of the hydrophilic layer B.

Content of the Organic Components

The fore going organic components lower the hydrophilicity and cause the contamination of the print when the crosslinking is formed to raise the durability and the water resistivity even if the organic component is the hydrophilic resin. Moreover, the organic components has a possibility of to lower the water-holding ability by blocking the orifice of the porous particle and or immersing into the opening to degrade the porosity. Consequently, the adding amount of the organic component is preferably small. In concrete, the amount of the organic component is preferably from 0.1 to 50%, more preferably from 1 to 30%, further preferable from 1 to 20%, by weight to the whole weight of the hydrophilic layer B.

Layer C

A layer C containing the light-heat conversion material may be arranged between the hydrophilic layer and the substrate. Basically the materials similar to those of the layer B may be used in the layer C. The coating liquid of the layer C may be acidic, and an acidic colloidal silica and alumina sol may be used other than the elements used in the hydrophilic layer B.

The amount of the organic component in the layer C is not limited as like as in the hydrophilic layer B since the layer C is not always required to be hydrophilic and porous. In concrete, the amount of the organic component is from 0 to 95%, preferably from 1 to 50%, more preferably from 2 to 30%, by weight to the whole weight of the layer C.

Substrate

Known materials used as the substrate of a printing plate can be used as the substrate of the printing plate element according to the invention. Examples of the substrate include a metal plate, a plastic film, paper treated with a polyolefin and a composite substrate formed by laminating the foregoing materials. The thickness of the substrate is not specifically limited as long as the substrate can be attached on a printing machine, and that having a thickness of from 50 to 500 μm is suitable for easy handling.

As the metal plate, iron, stainless steel and aluminum are usable, and aluminum is preferred from the viewpoint of the specific gravity and the stiffness thereof. The aluminum plate is usually used after the degreasing by an alkali or an acid for removing the oil adhered on the surface at the time of rolling and winding. The degreasing treatment by an alkali solution is preferred. Moreover, it is preferable to apply an adhesion ability increasing treatment of a subbing layer coating to raise the adhesiveness of the surface to the coated layer. In an example of such the method, the plate is immersed in a liquid containing a silicate or a coupling agent such as a silane coupling agent or coated with such the liquid and sufficiently dried. An anodized treatment is also usable which is considered as one kind of the adhesion ability increasing treatment. The anodizing treatment and the immersing or coating treatment may be applicable in combination. An aluminum plate roughened by a known method is also usable.

Examples of the plastic film include that of a poly (ethylene terephthalate), a poly(ethylene naphthalate), a polyimide, a polyamide, a polycarbonate, a polysulfon, a poly(phenylene oxide) and a cellulose ester. The poly (ethylene terephthalate) and poly(ethylene naphthalate) are particularly preferred. It is preferable that the surface of these plastic films on which the layer is to be coated is subjected to the adhesion ability increasing treatment or the subbing layer coating for raising the adhesion ability between the plastic film and the coated layer. Examples of the adhesion ability increasing treatment include a treatment by corona discharge, flame, plasma or UV irradiation. Examples of the subbing layer include a layer of gelatin and a layer containing a latex. A water-penetration preventing layer such as a poly(vinylidene chloride) layer as the subbing layer. Moreover, the water-penetration-preventing layer formed by evaporation of aluminum or silicon may be provided, and a subbing layer may be provided on the evaporated layer of aluminum or silicon.

The compound substrate is prepared by optionally laminating the foregoing materials, and the lamination may be carried out before or after the formation of the hydrophilic layer and just before attaching on the printing machine.

(2) Preparation Method of the Printing Plate Element

Dispersion Process a. Dispersing Pulverization the Porous Particle or Dispersing Layer-separation the Layer Structural Mineral The method for dispersing pulverization or layer separation can be roughly classified into a dry method and a wet method. In the dispersing pulverization process by the dry method, the process is relatively simple since the drying process is not necessary. However, the wet method is advantageous for dispersing pulverization until a size of sub-micron or a thickness of not less than 100 nm.

As the dispersing pulverization apparatus for the dry method, a high-speed rotary impact sharing mill such as an annular-type inomizer, an air flow crushing machine such as a jet mill, a roller mill, a dry medium stirring mill such as a ball mill and a compressing shearing crushing machine such as an ongle mill are usable. As the dispersing pulverization apparatus for the wet method, a wet medium stirring mill such as a ball mill and an aquamizer and a high-speed rotary shearing friction mill such as a colloid mill are usable.

The diameter of the porous particle after dispersing pulverization is preferably substantially not more than 1 μm, more preferably not more than 0.5 μm. A coarse grain may be removed by filtration when the coarse grain is remained after crushing. The particle of the layer structural mineral after the dispersing pulverization is preferably a thin layer having an average diameter (the largest length of the particle) of not more than 20 μm and an average aspect ratio (the ratio of the largest length of particle/thickness of particle). It is more preferable that the average diameter is not more than 10 μm and the aspect ratio is mot less than 50. The layer structural mineral particle may be subjected to a swelling process before the dispersing pulverization. When the wet method is applied, it is preferable that the porous particle and the layer-structural mineral particle are prepared to the coating liquid without drying. In some cases, the dispersing pluverized or dispersing layer-separated particles are recoagulated by the drying. The concentration and the dilution of the coating liquid is allowed for controlling the solid content of the liquid. The surface treatment of the particle can be performed by adding a surface treating agent into the dispersing pulverization or the dispersion layer dividing process. Furthermore, another component to be added to the coating liquid may be simultaneously dispersed by adding into the dispersing pulverization or the dispersion layer dividing process. Besides the other component may be added and redispersed after the dispersing pulverization or the dispersing layer-separation process. It is considered that a chemical reaction is simultaneously occurred in the course of the dispersing pulverization or the dispersing layer-separation process, and in some cases, the strength of the coated layer is raised when the other component is simultaneously dispersed.

b. Swelling Process of Layer-structural Mineral Particle

The swellable synthesized fluorinated mica capable of freely swelling is sufficiently swollen only by mixing and stirring with water and divided to a thin layer of an average thickness of not more than 10 nm to form a stable dispersion liquid.

Mg-barmiculite is become swellable, for example, by the following ion exchange treatment.

Mg-bermiculite+Lithium citrate aq.→Li-bermiculite+magnesium citrate aq.

The Li-bermiculite can be divided to a thin layer having an average thickness of not more than 10 nm by mechanically dispersion and layer-separation after limitedly swelling by the osmotic pressure.

c. Dissolving Process of Material 1*b* in Water

When the material 1*b* supplied in a form of powder, it is preferable that the material 1*b* is mixed with another water-soluble material powder such as the powder of material 2 or the polysaccharide powder and the water-soluble resin powder and dissolved in water to prepare an aqueous solution. The material 1*b* powder is difficult to dissolve in water when the material 1*b* is solely dissolved in water since a powder ball tends to be formed. A prolonged time is required for completely dissolution of the powder that causes raising of the production cost. Further, preparation of a high concentration solution is difficult.

For example, when a powder of ovalbumin and a powder of trehalose are each used as the material 1*b* and the material 2, respectively, an aqueous solution having a relatively high concentration of 15% by weight can be easily prepared by dissolving a mixture of the both powders in a weight ratio of 50:50 in water.

Coating Process

It is preferable for forming the layer A that the material 1, a powder of material 2 which is water-soluble and crystalline and has a melting point within the range of from 60 to 300° C. and the other sugars and/or the water-soluble resin are mixed in the powder form, and the mixed powder is dissolved. Thus prepared aqueous solution is coated on the substrate and dried to form the layer A. It is difficult to dissolve the water-soluble protein and/or the water-soluble glycoprotein powder in water since a powder ball tends to be formed. A prolonged time is required for completely dissolving the powder that causes raising of the production cost. Further, preparation of a high concentration solution is difficult even when the concentration is 3% by weight. Consequently, the concentration of the coating liquid of the layer A is inevitably lowered and the drying load is increased. As a result of that the total production efficiency is considerably lowered.

For example, an aqueous solution having a relatively high concentration of 15% by weight can be easily prepared when a mixture of the ovalbumin power and the trehalose powder in a ratio of 50:50 is used.

The coated layer A is preferably dried under a condition so that the material 1, the material 1*a* and/or material 1*b*, and the material 2 each contained in the layer are not molten or coagulated. The drying is preferably performed at a temperature of from 20 to 80° C., more preferably from 40 to 60° C. The drying time can be optionally set according to the drying condition such as the wind amount of blowing, and preferably from 0.1 to 60 minutes, more preferably from 0.5 to 10 minutes. The drying can be performed at a temperature higher than the above-mentioned. In such the case, the time for exposing to such the high temperature is preferably not more than 5 minutes, more preferably not more than 1 minute, further preferably not more than 0.5 minutes. It is preferable that the time for exposing to the high temperature in the wetted state when the material 1*b* is contained in the layer, since the material 1*b* in a solution state is coagulated at a temperature lower than that in the dried state.

The hydrophilic layer B can be dried within a temperature range at which the material is not burnt and the substrate is not affected by any bad influence when the material 1 is not contained in the layer. The drying is performed from 40 to 200° C., more preferably from 60 to 150° C., in concrete.

When the material 1 is contained in the layer, the layer is preferably dried a condition the same as that of the layer A. The uneven structure is formed in the hydrophilic layer B by the phase separation of the material contained in the layer, and the uneven structure can be controlled by the drying condition. The control of the uneven structure is preferably performed by suitably changing the blowing amount since the preferable drying temperature range is depended on the kind of the material contained in the layer.

The layer C can be formed in a way similar to that of the hydrophilic layer B. Each of the layer can be optionally subjected to an aging treatment individually in the order of the coating or after the coating of the all layers. The aging treatment is preferably performed at a temperature of from 40 to 150° C. for a time of 1 to 200 hours, when the material 1 is not contained in any of the layers. When the material 1 is contained any one of the layers, the aging is preferably performed at a temperature of from 40 to 60° C. for a time of from 1 to 200 hours.

(3) Image Forming Method

An infrared laser and a thermal head can be used for the image formation, and the infrared laser is preferred. The wavelength of the laser light is preferably from 800 to 1100 nm, and a near infrared laser light of from 800 to 850 nm is preferable. For forming the image, an usual exposing apparatus or an on-press printing machine, in which such the exposing apparatus is built, can be used. The exposure energy is preferably from 50 to 1,000 mj/cm$^2$, more preferably from 100 to 500 mj/cm$^2$.

Example of the usual exposing apparatus is one in which the printing plate element is fixed on the rotating cylindrical drum and the image is recorded by movable plural laser beams of from 16 ch to 240 ch with a wavelength of not less than 800 nm in the direction of the sub-scanning while the drum is rotated (the rotating direction is the main scanning direction). Although the irradiation of the beam is preferably performed on the layer A-coated surface, the irradiation can be performed from the substrate side when the substrate is composed of a material having a low absorbance at the wavelength of the light beam such as a high transparency resin film. A sheet may be inserted as a spacer between the printing plate element and the drum, and a sheet, preferably one having a low light absorption at the wavelength of the beam, is placed as a cover sheet on the printing plate element at the time of exposing. At this time, the relation of the positions of the plural beams, or beam arrangement, may be optionally set, and a system so-called interleave system may also be applied. There is no limitation on the shape of the beam, and it may be Gaussian in both of the direction of the main scanning and the sub-scanning, a rectangular or a shape intermediate of these shapes.

The beam diameter in the direction of the sub-scanning is preferably from 70 to 200%, more preferably from 90 to 180% of the one dot width of recording resolving power, for example about 10.6 $\mu$m when the resolving power is 2,400 dpi. The beam diameter is defined by the range in which the intensity is not less than 13.5% of the peak intensity of the beam, the beam size is preferably defined by the beam image formed at the interface between the layer A and the layer (layer B) positioned just under the layer A. The beam diameter in the direction of the main scanning is preferably from 30 to 300%, more preferably from 70 to 200% of the one dot width of recording resolving power. The dpi is defined by the image density per 2.54 cm.

There is no specific limitation on the method for removing the non-coagulated portion of the layer A by dissolving in water on the printing machine, and preferably using a method by which the printing plate element according to the invention is fixed on the printing drum and a wetting liquid drum is attached to the printing plate element and the wetting liquid is supplied while rotating the printing drum to remove the non-coagulated portion. At this time, an ink roller or a blanket drum may be attached to the printing plate material on the printing drum simultaneously or with a different timing. The removing process may also be performed while performing the printing. A cleaning may be performed at this time by contacting with a cleaning member such as a non-weave cloth to the printing plate element on the printing drum and/or the blanket drum.

An aqueous solution used for removing non-exposed areas of the printing plate element may be water or a solution.

Method for Giving Visibility to Image

A material for giving visibility to image can be added into any one of the layers. For example, known techniques applied to a thermal sensitive paper. Distinguish ability between the exposed portion and non-exposed areas may be formed by changing the light transparency or light scattering ability of the layer by heating by the light exposure.

In addition to the foregoing methods, image formation may be performed through an ink-jet system.

On the other hand, as to an ink-jet method, ink containing an acid is imagewise adhered by an ink-jet method onto the surface of a printing plate element comprising a substrate and a surface (preferably surface A) A containing at least one of a water-soluble protein and a water-soluble glycoprotein (preferably an oligosaccharide) so as to coagulate the whole of a part of the image area of the Layer A, and the non-coagulated area of the layer A is dissolved and removed by water to form an image.

Example of the acid-containing ink is an aqueous ink, and an acid such as acetic acid, phosphoric acid, hydrochloric acid, and sulfuric acid is usable as the acid to be contained in the ink although there is no specific limitation on the kind of the acid. The pH value of the ink is preferably not more than 6, more preferably within the range of from 1.2 to 4. Known materials, for example, a colorant such as a dye and a pigment, may be contained into the ink additionally to the acid. An ink drying process by heating and/or blowing may be provided within an extent in which any modification of the protein is not occurred, before the process for dissolving and removing the part of the area of the layer A.

In another embodiment for forming an image by the ink-jet method, an ink containing a light-heat conversion material is imagewise adhered by the ink-jet onto a printing plate element comprising a substrate and the layer A provided on the substrate, then the surface of the plate is uniformly irradiated by light having a wavelength capable of being absorbed by the light-heat conversion material to render the whole or a part of the image area of the layer A water-insoluble, and the area of the layer A which has not been water-insolubilized is dissolved and removed by water to form the image.

A dye or a water-soluble light-heat conversion material, and a pigment or water-insoluble light-heat conversion material are also usable as the light-heat conversion material, and the light absorption wavelength distribution of is not specifically limited. A material appeared black in visible light or one having a absorption peak within the range of from near infrared to infrared region is preferable.

An aqueous ink is preferably used, by which the light-heat conversion material can be distributed in the layer A by dissolving a part of the layer A by the solvent of the ink, since the layer A is water-soluble, although and any of an aqueous, oleaginous and thermally fusible ink can be used as the foregoing ink. When the light-heat conversion material is a dye, the light-heat conversion material may be permeated into the porous hydrophilic layer B and the layer C further to the layer A. The layer of the image area can be wholly heated by distributing the light-heat conversion material in the whole of the layer. The ink containing the light-heat conversion material is preferably permeated to at least apart of the layer B since it is necessary to coagulate the layer near the interface by heating near the interface of the layer A and the layer B to obtain a highly strengthen image. On the other hand, when the light-heat conversion material is a pigment, it is preferable that the average particle diameter of the pigment in the dispersed state is larger than the average diameter of the fine orifice of the layer B. When the average particle diameter of the pigment is larger than the average diameter of the fine orifice of the layer B, the blur of the image is inhibited and the resolving ability is raised since the major part of the pigment is sedimented on the surface of the layer B and the solvent of the ink is only permeated into the layer B.

In this method, a suitable amount of the light-heat conversion material may be contained in the printing plate element itself, in the substrate and/or any one of the layers provided on the substrate. In such the case, the sensitivity of the printing plate element can be raised since heat is generated at the all surface of the layer in a degree so as to occur no modification of the layer A by the uniform exposing after the ink-jet image recording additionally to the heat generation at the image recorded area.

A binder such as a water-soluble polymer, a surfactant, and another known material usually contained in an aqueous ink for ink-jet may be further contained in the composition of the aqueous ink, even though there is no limitation on the composition of the aqueous ink other than that the light-heat conversion material.

Examples of a material having an absorption peak within the range of from a near-infrared region to an infrared region include organic compounds such as cyanine dyes, chroconium dyes, polymethine dyes, azulenium dyes, squalium dyes, thiopyrilium dyes, naphthoquinone dyes and anthraquinone dyes; and organic metal complexes of phthalocyanine type, azo type, thioamido type, dithio type and indoaniline type. As other dyes, for example, a black material such as an azo dye, an anthraquinone compound, and a quinoneimine compound, and an infrared absorbing dye such as a cyanine and a phthalocyanine. The composition of the black ink described in International Patent Publication OW 98/46685 can be used as the composition of the dye ink.

As the pigment, the materials described in the foregoing description related to the light-heat conversion material such as carbon black, graphite, and titan black are usable. The particle diameter of the pigment is necessarily smaller than the diameter of nozzle of the ink-jet head, usually from 10 to 50 μm. It is preferable that the particle having a diameter of more than 10 μm is substantially not existed and the average diameter is not more than 0.1 μm. It is more preferable that the average diameter is not more than 0.1 μm and larger than the average diameter of the fine orifice of the layer B, concretely from 5 to 50 nm. The composition of the black ink described in JP O.P.I. No. 11-279470 may be applicable as the composition of the pigment ink.

An ink drying process by heat and/or blowing may be provided between the ink-jet recording process and the process for dissolving and removing the part of area of the layer A. The temperature of the ink drying process is preferably lower than the temperature at which a material of the layer A is rendered water-insoluble.

The method for exposing includes, for example, a uniform exposure by flash light such as the emitted by a xenon flash lamp. The exposure condition can be controlled by parameters such as the power of the light source, the distance to the light source, the lighting time of the flash lamp, the number of flashing. As such the exposing, the apparatus and the method described in JP O.P.I. No. 11-291481 may be applicable. When ink containing the light-heat conversion material having absorption in the region from near infrared to infrared is used, the uniform exposure may be performed by using the fore going infrared laser exposing apparatus.

In the invention, it is preferred that the image formation can be performed by an actual process-less procedure by caring out the process for dissolving and removing the part of area of the layer A by water on the printing machine.

There is no specific limitation on the method for removing the part of the layer A by dissolving by water on the printing machine, and preferably using a method by which the printing plate element according to the invention is fixed on the printing drum and a wetting liquid drum is contacted to the printing plate element and the wetting liquid is supplied while rotating the printing drum to remove the non-coagulated portion. At this time, an ink roller or a blanket drum may be contacted to the printing plate material on the printing drum simultaneously or with a different timing. The removing process may also be performed while performing the printing. A cleaning may be performed at this time by pressing a cleaning member such as a non-weave cloth to the printing plate element on the printing drum and/or the blanket drum.

EXAMPLES

The invention is described below according to examples. The embodiment of the invention is not limited by the examples. In the followings, "part" means "part by weight of the effective component" as long as a specific description is not described.

Example 1

1. Aluminum Substrate (1) AL Substrate 1

An aluminum substrate composed of 1050 aluminum having a thickness of 0.24 mm was treated by immersing in a 5% by weight aqueous solution of sodium silicate No. 3 at 70° C. for 120 seconds. Then the substrate was washed by water and sufficiently dried to prepare AL substrate 1.

(2) AL Substrate 2

An aluminum substrate composed of 1050 aluminum having a thickness of 0.24 mm was degreased by immersing in a 2% by weight aqueous solution of sodium hydroxide at 50° C. for 30 seconds. The substrate was sufficiently washed by water and subjected to an anodized treatment at 25° C. applying an electric voltage of 20 V using a 20% solution of sulfuric acid to form 0.5 g/m$^2$ of an anodized oxide layer. After sufficient washing, the anodized substrate was treated by immersing into a 2% by weight aqueous solution of sodium silicate No. 3 at 70° C. for 30 seconds. Then the substrate was washed-by water and sufficiently dried to prepare AL substrate 2.

(3) AL Substrate 3

An aluminum substrate on which the anodized oxide layer was formed in the same manner as in AL substrate 2 was treated by immersing into an aqueous solution of 2% by weight of di-sodium phosphate, pH value of which was adjusted to 11 by sodium hydroxide, at 70° C. for 30 seconds. Then the substrate was washed by water and sufficiently dried to prepare AL substrate 3.

(4) AL Substrate 4

An organic-inorganic sol-gel layer was formed by the method described in JP O.P.I. No. 8-240914 on an aluminum substrate on which the anodized oxide layer was formed in the same manner as in AL substrate 2.

2. PET Substrate

Formation of Subbing Layer

A subbing layer composed of two layers was formed on a PET film having a thickness of 0.18 mm by the following procedure.

1) First Subbing Layer

The surface to be coated of the PET substrate was subjected to a corona discharge treatment and a coating liquid having the following composition was coated on the substrate at 20° C. and a relative humidity of 55% by a wire bare so that the layer thickness after dried is 0.4 μm. Then the coated layer was dried at 140° C. for 2 minutes.

| Composition of the fist subbing layer | |
|---|---|
| Acryl latex particle (n-butyl acrylate/t-butyl acrylate/styrene/hydroxyethyl methacrylate = 28/22/25/25) | 36.9 g |
| Surfactant A | 0.36 g |
| Hardener a | 0.98 g |
| Distilled water to make | 1 l |

2) Second Subbing Layer

The foregoing first subbing layer surface coated on the film was subjected to a corona treatment. Then a liquid having the following composition was coated on the surface at 35° C. and a relative humidity of 22% by a wire bare so that the layer thickness after dried is 0.1 μm. Then the coated layer was dried at 140° C. for 2 minutes.

| Composition of the second subbing layer | |
|---|---|
| Gelatin | 9.6 g |
| Surfactant A | 0.4 g |
| Hardener b | 0.1 g |
| Distillated water to make | 1 l |

Surfactant A

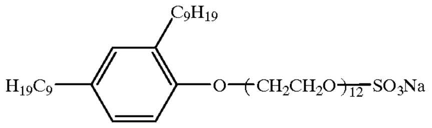

Hardener a

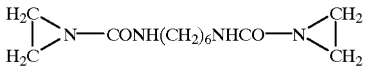

Hardener b

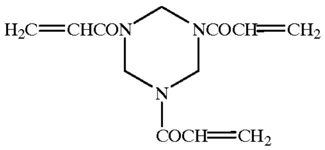

3. PET/AL Composite Substrate

On both surfaces of a PET film having a thickness of 0.05 mm, a subbing layer the same as in the foregoing PET substrate was formed. Besides, a polyurethane type adhesive agent was coated on a surface of a degreased 0.05 mm aluminum substrate composed of 1050 aluminum so that the coated amount was 3 $g/m^2$. The foregoing PET film subbed on both sides are laminated on the adhesive surface of the aluminum substrate, and aged at 60° C. for 24 hours to obtain a PET/AL composite substrate 4. Preparation of Light-heat Conversion Covered Particle The surface of a core particle was covered by a light-heat conversion material and another material by a dry method using a sand grinder and a glass bead (Hibea 20). The rotation speed of the disc was 800 rpm and the dispersion time by dry method was 60 minutes. The core particle and the covering material were described below. The unit of the composition is parts by weight. The covered particles was stirred in water to separate from the glass beads and recovered in a form of a suspension containing 10% by weight of the covered particles.

| Suspension of particle covered with light-heat conversion material | |
|---|---|
| Core particle: PMMA particle MX220 (Soken Kagaku Co., Ltd., average diameter; 2 μm) | 65.0 |
| Titan Black 13M (Mitsubishi Material Co., Ltd.) | 25.0 |
| Alumina AKP-G008 (Sumitomo Kagaku Co., Ltd.) | 10.0 |
| Purified water | 900.0 |

5. Preparation of Coating Liquid

Preparation of Coating Liquid of the Layer A

Liquids each having the later-mentioned composition were prepared. Ultrasonic wave was applied to each of the liquids after the sufficient stirring, then the liquids were each filtered to prepare the coating liquids.

In the coating liquid 7, 3 parts of ovalbumin powder as the material 1*b* was added into a vessel in which 97 parts of purified water was put in advance, and primarily dissolved by standing for 24 hours at 5° C. Then the solution was sufficiently stirred and ultrasonic wave was applied for 15 minutes for completely dissolving the ovalbumin. The temperature after the application of the ultrasonic wave was not more than 30° C. Thus obtained solution was filtered to prepare the coating liquid. In the coating liquids A-8, A-10 and A-11, the following powder of material 1*b* and the powder of material 2 were sufficiently mixed in the powder state and the mixture was added to purified water at 25° C. while the water was stirred for dissolution. The stirring was continued further 10 minutes after finishing the addition of the powder. After the, the ultrasonic wave was applied for 10 minutes to accelerate the dissolution. The temperature after the application of the ultrasonic wave was not more than 30° C. Thus obtained solutions were each filtered to prepare the coating liquids. These liquids could be considerably easily prepared compared with the coating liquid 7.

| Coating liquid A-1 | |
|---|---|
| Material 1a: Carnauba wax emulsion A118 (GifuShellac Co., Ltd., Average particle diameter: 0.3 μm, Softening point: 65° C., Melting point: 80° C., Molten viscosity at 140° C.; 8 cps, Solid content: 40% by weight) Used in a form of diluted liquid having a solid content of 6% by weight by purified water | 40.0 |
| Material 2: Disaccharide Trehaohse powder (Hayashibara Shoji Co., Ltd., Commercial name: Torehaohse, Melting point: 97° C.) used in a form of aqueous solution having a the solid content of 6% by weight | 60.0 |
| Solids content of coating liquid | 6.0% by weight |

| Coating liquid A-2 | |
|---|---|
| Material 1a: Calnauba wax emulsion A118 | 45.0 |
| Material 2: Disaccharide Maltose powder (Hayashibara Shoji Co., Ltd., Commercial name: Sanmalt, Melting point: 110–130° C.) used in a form of aqueous solution having a solid content of 6% by weight | 55.0 |
| Solids content of coating liquid | 6.0% by weight |

| Coating liquid A-3 | |
|---|---|
| Material 1a: Calnauba wax emulsion A118 | 40.0 |
| Material 2: Disaccharide Sucrose powder (Kanto Kagaku Co., Ltd., Reagent, Melting point: 182° C.) used in a form of aqueous solution having a solid content of 6% by weight | 60.0 |
| Solids content of coating liquid | 6.0% by weight |

| Coating liquid A-4 | |
|---|---|
| Material 1a: Calnauba wax emulsion A118 | 40.0 |
| Material 2: Disaccharide Trehaohse powder (Hayashibara Shoji Co., Ltd., Commercial | 50.0 |

-continued

| Coating liquid A-4 | |
|---|---|
| name: Torehaose Melting point: 97° C.) used in a form of aqueous solution having a solid content of 6% by weight | |
| Matting agent, Silton AMT08 (Mizusawa Kagaku Co., Ltd., Porous alumino-silicate particle, Average particle diameter: 0.6 μm) Used in a form of aqueous dispersion having a solid content of 6% by weight | 10.0 |
| Solids content of coating liquid | 6.0% by weight |

| Coating liquid A-5 | |
|---|---|
| Material 1a: Calnauba wax emulsion A118 | 55.0 |
| Material 2: Disaccharide Sucrose powder (Kanto Kagaku Co., Ltd., Reagent, Melting point: 182° C.) used in a form of aqueous solution having a solid content of 6% by weight | 35.0 |
| Graphite aqueous dispersion Hitasol GM-66A (Hitach Funmatsu Yakin Co., Ltd., Solid content: 10% by weight) used in a form of diluted liquid having a solid content of 6% by weight by purified water | 10.0 |
| Solids content of coating liquid | 6.0% by weight |

| Coating liquid A-6 | |
|---|---|
| Material 1a: Calnauba wax emulsion A118 | 40.0 |
| Material 2: Disaccharide Sucrose powder (Kanto Kagaku Co., Ltd., Reagent, Melting point: 182° C.) used in a form of aqueous solution having solids content of 6% by weight | 30.0 |
| Polymer particle Yodosol GD87B aqueous dispersion (Kanebo NSC Co., Ltd., Average particle diameter: 90 nm, Tg: 60° C., Solid content: 50% by weight) used in a form of diluted liquid having a solid content was 6% by weight by purified water | 30.0 |
| Solids content of coating liquid | 6.0% by weight |

| Coating liquid A-7 | |
|---|---|
| Material 1b: Ovalbumin powder (Wako Junyaku Co., Ltd.) | 3.0 |
| Purified water | 97.0 |
| Solids content of coating liquid | 3.0% by weight |

| Coating liquid A-8 | |
|---|---|
| Material 1b: Ovalbumin powder (Wako Junyaku Co., Ltd.) | 3.0 |
| Material 2: Disaccharide, Trehalose powder (Hayashibara Shoji Co., Ltd., Commercial name: Trehaose) | 3.0 |
| Purified water | 94.0 |
| Solids content of coating liquid | 6.0% by weight |

-continued

| Coating liquid A-9 | |
|---|---|
| Coating liquid A-8 | 91.0 |
| Graphite aqueous dispersion Hitasol GM-66A (Hitach Funmatsu Yakin Co., Ltd., Solid content: 10% by weight) | 5.5 |
| Purified water | 3.5 |
| Solids content | 6.0% by weight |

| Coating liquid A-10 | |
|---|---|
| Material 1b: Ovalbumin powder (Wako Junyaku Co., Ltd.) | 3.0 |
| Material 2: Disaccharide, Maltose powder (Hayashibara Shoji Co., Ltd., Commercial Name: Sanmalt) | 3.0 |
| Purified water | 94.0 |
| Solids content of coating liquid | 6.0% by weight |

| Coating liquid A-11 | |
|---|---|
| Material 1b: Ovalbumin powder (Wako Junyaku Co., Ltd.) | 2.5 |
| Material 2: Disaccharide, Trehalose powder (Hayashibara Shoji Co., Ltd., Commercial Name: Trehaose) | 3.5 |
| Purified water | 94.0 |
| Solids content of coating liquid | 6.0% by weight |

| Coating liquid A-12 | |
|---|---|
| Coating liquid A-8 | 70.0 |
| Material 1a: Carnauba wax emulsion A118 | 30.0 |
| Solids content of coating liquid | 6.0% by weight |

| Coating liquid A-13 | |
|---|---|
| Coating liquid A-8 | 70.0 |
| Material 1a, Microcrystalline wax emulsion A206 (Gifu Celac Co., Ltd., Average particle diameter: 0.5 μm, Softening point: 65° C., Melting point: 108° C., Molten viscosity at 140° C.; 8 cps, Solid content: 40% by weight) used in a form of diluted liquid by purified water having a solid content of 6% by weight | 20.0 |
| Matting agent, Silton AMT08 (Mizusawa Kagaku Co., Ltd., Porous alumino-silicate particle, Average particle diameter: | 10.0 |

-continued

| Coating liquid A-13 | |
|---|---|
| 0.6 μm) used in a form of aqueous dispersion having a solid content of 6% by weight | |
| Solids content of coating liquid | 6.0% by weight |

Preparation of Coating Liquid of Hydrophilic Layer B

Coating liquids having the following composition were prepared. Each liquid was sufficiently stirred and subjected to the application of ultrasonic wave for 5 minutes. Then the liquid was filtered to prepare the coating liquid.

| Coating liquid B-1 | |
|---|---|
| Colloidal silica (alkaline), Snowtex-S (Nissan Kagaku Co., Ltd., Solid content: 30% by weight) | 25.0 |
| Necklace-shaped colloidal silica (alkaline) Snowtex-PSM (Nissan Kagaku Co., Ltd., Solid content: 20% by weight) | 50.0 |
| Matting agent, Silton AMT08 (Mizusawa Kagaku Co., Ltd., Porous alumino-silicate particle, Average particle diameter: 0.6 μm) | 5.0 |
| Carbon black aqueous dispersion SD9020 (Dainihon Ink Co., Ltd., Solid content: 30% by weight) | 5.0 |
| Purified water | 35.0 |
| Solids content of coating liquid | 20.0% by weight |

| Coating liquid B-2 | |
|---|---|
| Colloidal silica (alkaline), Snowtex-XS (Nissan Kagaku Co., Ltd., Solid content: 20% by weight) | 30.0 |
| Necklace-shaped colloidal silica (alkaline) Snowtex-PSM (Nissan Kagaku Co., Ltd., Solid content: 20% by weight) | 50.0 |
| Matting agent, Silton AMT08 (Mizusawa Kagaku Co., Ltd., Porous alumino-silicate particle, Average particle diameter: 0.6 μm) | 5.0 |
| Graphite aqueous dispersion Hitasol GA-66M (Hitachi Funmatsu Yakin Co., Ltd., Solid content: 10% by weight) | 15.0 |
| Purified water | 12.5 |
| Solids content | 20.0% by weight |

| Coating liquid B-3 | |
|---|---|
| Colloidal silica (alkaline, Snowtex-S (Nissan Kagaku Co., Ltd., Solid content: 30% by weight) | 14.0 |
| Necklace-shaped colloidal silica (alkaline) Snowtex-PSL (Nissan Kagaku Co., Ltd., Solid content: 35% by weight) | 21.0 |
| Titan black covered particle suspension 1-1 (Solid content 10% by weight) | 65.0 |

-continued

| Coating liquid B-3 | |
|---|---|
| Purified water | 0.3 |
| Solids content of coating liquid | 18.0% by weight |

| Coating liquid B-4 | |
|---|---|
| Colloidal silica (alkaline), Snowtex-S (Nissan Kagaku Co., Ltd., Solid content: 30% by weight) | 25.0 |
| Necklace-shaped colloidal silica (alkaline) Snowtex-PSM (Nissan Kagaku Co., Ltd., Solid content: 20% by weight) | 50.0 |
| Matting agent, Silton AMT08 (Mizusawa Kagaku Co., Ltd., Porous alumino-silicate particle, Average particle diameter: 0.6 μm) | 4.0 |
| Sodium salt of carboxymethyl cellulose (Kanto Kagaku Co., Ltd., Reagent) used in a form of aqueous solution, solid content: 3% by weight | 8.0 |
| Graphite aqueous dispersion Hitasol GA-66M (Hitachi Funmatsu Yakin Co., Ltd., Solid content: 10% by weight) | 13.0 |
| Purified water | 15.2 |
| Solids content of coating liquid | 20.0% by weight |

| Coating liquid B-5 | |
|---|---|
| Colloidal silica (alkaline), Snowtex-S (Nissan Kagaku Co., Ltd., Solid content: 30% by weight) | 22.0 |
| Necklace-shaped colloidal silica (alkaline) Snowtex-PSM (Nissan Kagaku Co., Ltd., Solid content: 20% by weight) | 45.0 |
| Matting agent, Silton AMT08 (Mizusawa Kagaku Co., Ltd., Porous alumino-silicate particle, Average particle diameter: 0.6 μm) | 5.0 |
| Sodium salt of carboxymethyl cellulose (Kanto Kagaku Co., Ltd., Reagent) used in a form of aqueous solution having solid content: 3% by weight | 10.0 |
| Material 1a: Carnauba wax emulsion A118 | 3.0 |
| Surfactant FZ2161 | 3.0 |
| Used in a form of diluted aqueous solution having a solid content of 1% by weight | |
| Graphite aqueous dispersion Hitasol GA-66M (Hitachi Funmatsu Yakin Co., Ltd., Solid content: 10% by weight) | 15.0 |
| Purified water | 15.1 |
| Solids content of coating liquid | 20.0% by weight |

| Coating liquid B-6 | |
|---|---|
| Colloidal silica (alkaline), Snowtex-S (Nissan Kagaku Co., Ltd., Solid content: 30% by weight) | 20.0 |
| Necklace-shaped colloidal silica (alkaline) Snowtex-PSM (Nissan Kagaku Co., Ltd., Solid content: 20% by weight) | 45.0 |
| Matting agent, Silton AMT08 (Mizusawa Kagaku Co., Ltd., Porous alumino-silicate particle, Average particle diameter: 0.6 μm) | 5.0 |
| Sodium salt of carboxymethyl cellulose | 8.0 |

-continued

| Coating liquid B-6 | |
|---|---|
| (Kanto Kagaku Co., Ltd., Reagent) used in a form of aqueous solution having solids content: 3% by weight | |
| Coating liquid A-1 (Solid content 6% by weight) | 33.4 |
| Surfactant FZ2161 Used in a form of diluted aqueous solution having a solids content of 1% by weight | 3.0 |
| Graphite aqueous dispersion Hitasol GA-66M (Hitachi Funmatsu Yakin Co., Ltd., Solids content: 10% by weight) | 13.0 |
| Purified water | 0.0 |
| Solids content of coating liquid | 18.5% by weight |

| Coating liquid B-7 | |
|---|---|
| Colloidal silica (alkaline), Snowtex-S (Nissan Kagaku Co., Ltd., Solid content: 30% by weight) | 20.0 |
| Necklace-shaped colloidal silica (alkaline) Snowtex-PSM (Nissan Kagaku Co., Ltd., Solid content: 20% by weight) | 45.0 |
| Matting agent, Silton AMT08 (Mizusawa Kagaku Co., Ltd., Porous alumino-silicate particle, Average particle diameter: 0.6 μm) | 5.0 |
| Sodium salt of carboxymethyl cellulose (Kanto Kagaku Co., Ltd., Reagent) used in a form of aqueous solution having solids content: 3% by weight | 8.0 |
| Coating liquid A-12 (Solid content 6% by weight) | 44.5 |
| Surfactant FZ2161 Used in a form of diluted aqueous solution having a solids content of 1% by weight | 3.0 |
| Graphite aqueous dispersion Hitasol GA-66M (Hitachi Funmatsu Yakin Co., Ltd., Solid content: 10% by weight) | 13.0 |
| Purified water | 0.0 |
| Solids content of coating liquid | 17.5% by weight |

| Coating liquid B-8 | |
|---|---|
| Colloidal silica (alkaline), Snowtex-S (Nissan Kagaku Co., Ltd., Solid content: 30% by weight) | 22.0 |
| Necklace-shaped colloidal silica (alkaline) Snowtex-PSM (Nissan Kagaku Co., Ltd., Solid content: 20% by weight) | 45.0 |
| Matting agent, Silton AMT08 (Mizusawa Kagaku Co., Ltd., Porous alumino-silicate particle, Average particle diameter: 0.6 μm) | 5.0 |
| Layer structural mineral particle, Somasif ME-100 (Corp Chemical Co., Ltd., Swellable mica, Average particle diameter: 3–5 μm) used in a form of aqueous dispersion having a solid content of 5% by weigh | 5.0 |
| Sodium salt of carboxymethyl cellulose (Kanto Kagaku Co., Ltd., Reagent) used in a form of aqueous solution having solid content: 3% by weight | 10.0 |
| Material 1a: Carnauba wax emulsion A118 | 3.0 |
| Surfactant FZ2161 Used in a form of diluted aqueous solution having a solid content of 1% by weight | 3.0 |
| Graphite aqueous dispersion Hitasol GA-66M (Hitachi Funmatsu Yakin Co., Ltd., Solid content: 10% by weight) | 15.0 |
| Purified water | 11.4 |
| Solids content of coating liquid | 20.0% by weight |

| Coating liquid B-9 | |
|---|---|
| Colloidal silica (alkaline), Snowtex-XS (Nissan Kagaku Co., Ltd., Solid content: 20% by weight) | 35.0 |
| Necklace-shaped colloidal silica (alkaline) Snowtex-PSM (Nissan Kagaku Co., Ltd., Solid content: 20% by weight) | 50.0 |
| Matting agent, Silton AMT08 (Mizusawa Kagaku Co., Ltd., Porous alumino-silicate particle, Average particle diameter: 0.6 μm) | 2.0 |
| Graphite aqueous dispersion Hitasol GA-66M (Hitachi Funmatsu Yakin Co., Ltd., Solid content: 10% by weight) | 13.0 |
| Purified water | 125.5 |
| Solids content of coating liquid | 9.0% by weight |

| Coating liquid B-10 | |
|---|---|
| Colloidal silica (alkaline), Snowtex-S (Nissan Kagaku Co., Ltd., Solid content: 30% by weight) | 25.0 |
| Necklace-shaped colloidal silica (alkaline) Snowtex-PSM (Nissan Kagaku Co., Ltd., Solid content: 20% by weight) | 46.0 |
| Matting agent, Silton AMT200B (Mizusawa Kagaku Co., Ltd., Porous alumino-silicate particle, Average particle diameter: 2 μm) | 1.0 |
| Sodium salt of carboxymethyl cellulose (Kanto Kagaku Co., Ltd., Reagent) used in a form of aqueous solution having a solid content of 3% by weight | 15.0 |
| Graphite aqueous dispersion Hitasol GA-66M (Hitachi Funmatsu Yakin Co., Ltd., Solid content: 10% by weight) | 13.0 |
| Purified water | 116.0 |
| Solids content of coating liquid | 9.0% by weight |

| Coating liquid B-11 | |
|---|---|
| Colloidal silica (alkaline), Snowtex-S (Nissan Kagaku Co., Ltd., Solid content: 30% by weight) | 25.0 |
| Necklace-shaped colloidal silica (alkaline) Snowtex-PSM (Nissan Kagaku Co., Ltd., Solid content: 20% by weight) | 60.0 |
| Matting agent, Silton AMT200B Mizusawa Kagaku Co., Ltd., Porous alumino-silicate particle, Average particle diameter: 2 μm) | 1.0 |
| Sodium salt of carboxymethyl cellulose (Kanto Kagaku Co., Ltd., Reagent) used in a form of aqueous solution having a solid content of 3% by weight | 14.0 |
| Purified water | 132.4 |
| Solids content of coating liquid | 9.0% by weight |

| Coating liquid B-12 | |
|---|---|
| Coating liquid B-10 (Solid content: 9% by weight) | 90.0 |
| Material 1a: Carnauba wax emulsion A118 (Gifu Celac Co., Ltd., Average particle diameter: 0.3 μm, Softening point: 65° C., Melting point: 80° C., Molten viscosity at 140° C.; 8 cps, Solid content: 40% by weight) used in a form of diluted liquid by purified water, having a solid content of 9% by weight | 10.0 |
| Purified water | 0.0 |
| Solid content of coating liquid | 9.0% by weight |

Preparation of Coating Liquid of Layer C)

Coating liquids having the following composition were prepared. Each liquid was sufficiently stirred and subjected to the application of ultrasonic wave for 5 minutes. Then the liquid was filtered to prepare the coating liquid.

| Coating liquid C-1 | |
|---|---|
| Colloidal silica (alkaline), Snowtex-S (Nissan Kagaku Co., Ltd., Solid content: 30% by weight) | 40.0 |
| Necklace-shaped colloidal silica (alkaline) Snowtex-PSL (Nissan Kagaku Co., Ltd., Solid content: 35% by weight) | 30.0 |
| Graphite aqueous dispersion Hitasol GA-66M (Hitachi Funmatsu Yakin Co., Ltd., Solid content: 10% by weight) | 30.0 |
| Purified water | 27.5 |
| Solid content of coating liquid | 20.0% by weight |

| Coating liquid C-2 | |
|---|---|
| Colloidal silica (alkaline), Snowtex-S (Nissan Kagaku Co., Ltd., Solid content: 30% by weight) | 30.0 |
| Necklace-shaped colloidal silica (alkaline) Snowtex-PSM (Nissan Kagaku Co., Ltd., Solid content: 20% by weight) | 45.0 |
| Disaccharide: Trehalose powder (Hayashibara Shoji Co., Ltd., Commercial name: Trehaose) used in a form of aqueous solution having a solid content of 20% by weight | 7.0 |
| Matting agent, Silton AMT08 (Mizusawa Kagaku Co., Ltd., Porous alumino-silicate particle, Average particle diameter: 0.6 μm) | 12.0 |
| Carbon Black aqueous dispersion SD9020 (Dainihon Ink Co., Ltd., Solid content: 30% by weight) | 12.0 |
| Purified water | 69.0 |
| Solid content of coating liquid | 20.0% by weight |

| Coating liquid C-3 | |
|---|---|
| Colloidal silica (alkaline), Snowtex-S (Nissan Kagaku Co., Ltd., Solid content: 30% by weight) | 35.0 |
| Necklace-shaped colloidal silica (alkaline) Snowtex-PSL (Nissan Kagaku Co., Ltd., Solid content: 35% by weight) | 30.0 |

-continued

| Coating liquid C-3 | |
|---|---|
| Snowtex-PSL (Nissan Kagaku Co., Ltd., Solid content: 35% by weight) | |
| Disaccharide: Trehalose powder (Hayashibara Shoji Co., Ltd., Commercial name: Trehaose) used in a form of aqueous solution having a solid content of 20% by weight | 8.0 |
| Matting agent, Silton AMT08 (Mizusawa Kagaku Co., Ltd., Porous alumino-silicate particle, Average particle diameter: 0.6 μm) | 15.0 |
| Graphite aqueous dispersion Hitasol GA-66M (Hitachi Funmatsu Yakin Co., Ltd., Solid content: 10% by weight) | 12.0 |
| Purified water | 94.0 |
| Solid content of coating liquid | 20.0% by weight |

| Coating liquid C-4 | |
|---|---|
| Colloidal silica (alkaline), Snowtex-S (Nissan Kagaku Co., Ltd., Solid content: 30% by weight) | 20.0 |
| Necklace-shaped colloidal silica (alkaline), Snowtex-PSL (Nissan Kagaku Co., Ltd., Solid content: 35% by weight) | 20.0 |
| Disaccharide: Trehalose powder (Hayashibara Shoji Co., Ltd., Commercial name: Trehaose) used in a form of aqueous solution having a solid content of 20% by weight | 3.0 |
| Titan Black covered particle suspension (Solid content: 10% by weight) | 80.0 |
| Solid content of coating liquid | 17.6% by weight |

Preparation of Coating Liquid of Comparative Image Forming Layer

Coating liquids having the following composition were prepared. Each liquid was sufficiently stirred and subjected to the application of ultrasonic wave for 5 minutes. Then the liquid was filtered to prepare the coating liquid.

| Coating liquid D-1 | |
|---|---|
| Poly(vinyl alcohol): Z-100 (Nihon Gosei Kagaku Co., Ltd., Aqueous solution having a solid content of 6% by weight) | 70.0 |
| Carnauba wax Emulsion A118 | 20.0 |
| Matting agent, Silton AMT08 (Mizusawa Kagaku Co., Ltd., Porous alumino-silicate particle, Average particle diameter: 0.6 μm) used in a form of aqueous dispersion having a solid content of 6% by weight | 10.0 |
| Solid content of coating liquid | 6.0% by weight |

| Coating liquid D-2 | |
|---|---|
| Carboxymethyl cellulose 1220 (Daisel Co., Ltd., 3% by weight aqueous solution) | 66.0 |
| Carnauba wax Emulsion A118 | 24.0 |
| Matting agent, Silton AMT08 | 10.0 |

-continued

| Coating liquid D-2 | |
|---|---|
| (Mizusawa Kagaku Co., Ltd., Porous alumino-silicate particle, Average particle diameter: 0.6 μm) used in a form of aqueous dispersion having a solid content of 6% by weight | |
| Solid content of coating liquid | 4.0% by weight |

| Coating liquid D-3 | |
|---|---|
| Colloidal silica (alkaline) Snowtex 20L (Nissan Kagaku, Co., Ltd., Solid content: 20% by weight) used in a form of diluted liquid having a solid content of 6% by weight by purified water) | 60.0 |
| Microcrystalline wax emulsion A206 (Gifu Celac Co., Ltd., Average particle diameter: 0.5 μm, Softening point: 65° C., Melting point: 108° C., Molten viscosity at 140° C.; 8 cps, Solid content: 40% by weight) used in a form of diluted liquid by purified water having a solid content of 6% by weight | 30.0 |
| Matting agent, Silton AMT08 (Mizusawa Kagaku Co., Ltd., Porous alumino-silicate particle, Average particle diameter: 0.6 μm) sed in a form of aqueous dispersion having a solid content of 6% by weight | 10.0 |
| Solid content of coating liquid | 6.0% by weight |

6-1. Preparation of Printing Plate Element

Samples 1-1 through 1-19 were prepared using the substrates which have the layer structures shown in Table 2

Image Forming Procedure

A cylindrical outside drum type laser exposing apparatus with 32 ch multi-beam of wavelength of 830 nm having a resolving power of 4,000 dpi was used. An image including 3, 5, 10, 50, 90, 95, and 97% halftone images of 4,000 dpi and 175 lines per inch and a solid image, and line and space patterns in the main scanning, sub-scanning and oblique directions each having a resolving power of 500, 1,000, 2,000, and 4,000 dpi was recorded by exposure from the side of the layer A. The exposure energy was stepwise varied within the range of from 200 to 450 mj/cm$^2$ at every 50 mj/cm$^2$. The image formed by the optimal exposure was selected and subjected to the printing evaluation in each of the tested plates.

Printing Process

The plate on which a latent image was formed was subjected to the printing performance. The printing was performed by a printing machine DAIYA1F-1, manufacture by Mitsubishi Jukogyo Co., Ltd., using coated paper, Wetting liquid H Solution SG-51 in a concentration of 1.5%, manufactured Tokyo Ink Co, Ltd., and Ink Toyo King High Eco M (magenta), manufactured by Toyo Ink Co., Ltd. At the initial time of the printing, the wetting liquid roller was firstly contacted only to the printing drum and rotated for 10 seconds while supplying the wetting liquid, then the printing was started in the usual procedure.

Evaluation of the Prints

Evaluation of S/N Ratio of Image

Thus obtained print was evaluated from the viewpoint of the occurrence of background contamination and the discriminability of the line and space image of 2,000 dpi. Results of the evaluation are shown in Table 2.

TABLE 2

| | | Layer B | | Layer A | | |
|---|---|---|---|---|---|---|
| Sample No. | Substrate | Coating solution No. | Layer forming method | Coating solution No. | Layer forming method | Evaluation of printed image |
| 1-1 | PET substrate | B-1 | *1 | A-1 | *2 | *3 |
| 1-2 | PET substrate | B-1 | *1 | A-3 | *2 | *3 |
| 1-3 | PET substrate | B-1 | *1 | A-8 | *2 | *3 |
| 1-4 | PET substrate | B-2 | *1 | A-2 | *2 | *3 |
| 1-5 | PET substrate | B-2 | *1 | A-3 | *2 | *3 |
| 1-6 | Pet substrate | B-2 | *1 | A-4 | *2 | *3 |
| 1-7 | PET substrate | B-2 | *1 | A-6 | *2 | *3 |
| 1-8 | PET substrate | B-2 | *1 | A-9 | *2 | *3 |
| 1-9 | PET substrate | B-2 | *1 | A-12 | *2 | *3 |
| 1-10 | PET substrate | B-2 | *1 | A-13 | *2 | *3 |
| 1-11 | PET substrate | B-3 | *1 | A-8 | *2 | *3 |
| 1-12 | PET substrate | B-3 | *1 | A-10 | *2 | *3 |
| 1-13 | AL substrate 1 | B-1 | *1 | A-1 | *2 | *3 |
| 1-14 | AL substrate 2 | B-2 | *1 | A-3 | *2 | *3 |
| 1-15 | AL substrate 3 | B-2 | *1 | A-11 | *2 | *3 |
| 1-16 | AL substrate 4 | B-3 | *1 | A-12 | *2 | *3 |
| 1-17 | PET/Al composite | B-2 | *1 | A-5 | *2 | *3 |
| 1-18 | PET/Al composite | B-3 | *1 | A-6 | *2 | *3 |
| 1-19 | PET substrate | B-1 | *1 | A-7 | *2 | *4 |

*1: Coated by a wire bar No. 10 and dried at 70° C. for 5 minutes
*2: Coated by a wire bar No. 5 and dried at 55° C. for 5 minutes
*3: A print with a good S/N ratio
*4: Background contamination was occurred even though the image was obtained.

It is understood from Table 2 that Samples 1-1 through 1-18 according to the invention give each a good print. Contrary to that, the background contamination was occurred on the comparative Sample 1-19 containing the material 1 in the layer A even though the image can be formed since the developability by water is insufficient.

Example 2

Samples 2-1 through 2-25 were prepared using the substrates and having the layer structures shown in Tables 3 and 4.

At the step at which the hydrophilic layer B was coated, the state of the surface of the hydrophilic layer B was observed by a three dimensional surface roughness measur ing apparatus RST plus, manufactured by Wyko Co., Ltd., with a magnification of 40. The surface was observed after spattered with a 1.5 nm layer of platinum-palladium to increase the reflection of the surface for easy observation. Evaluated results are shown in Tables 3 and 4.

TABLE 3

| | | Layer C | | Layer B | | Layer A | | |
|---|---|---|---|---|---|---|---|---|
| Sample No. | Substrate | Coating solution No. | Layer forming method | Coating solution No. | Layer forming method | Coating solution No. | Layer forming method | Observation result of surface |
| 2-1 | PET substrate | — | — | B-2 | *2 | A-1 | *4 | *5 |
| 2-2 | PET substrate | — | — | B-5 | *1 | A-6 | *4 | *6 |
| 2-3 | PET substrate | C-1 | *1 | B-11 | *1 | A-3 | *4 | *7 |
| 2-4 | PET substrate | C-2 | *2 | B-12 | *1 | A-6 | *4 | *7 |
| 2-5 | PET substrate | C-4 | *2 | B-9 | *1 | A-13 | *4 | *5 |
| 2-6 | AL substrate 3 | — | — | B-6 | *2 | A-6 | *4 | *6 |
| 2-7 | AL substrate 4 | C-3 | *2 | B-10 | *1 | A-12 | *4 | *7 |
| 2-8 | PET/AL composite substrate | — | — | B-2 | *2 | A-9 | *4 | *5 |
| 2-9 | PET/AL composite substrate | — | — | B-4 | *2 | A-4 | *4 | *6 |
| 2-10 | PET/AL composite substrate | — | — | B-5 | *2 | A-5 | *4 | *6 |
| 2-11 | PET/AL composite substrate | — | — | B-5 | *3 | A-6 | *4 | *6 |
| 2-12 | PET/AL composite substrate | — | — | B-6 | *2 | A-11 | *4 | *6 |

*1: Coated by a wire bar No. 5 and dried at 70° C. for 5 minutes
*2: Coated by a wire bar No. 10 and dried at 70° C. for 5 minutes
*3: Coated by a wire bar No. 12 and dried at 70° C. for 5 minutes
*4: Coated by a wire bar No. 4 and dried at 55° C. for 3 minutes
*5: No regular uneven structure was observed.
*6: Uneven structure having a pitch of 2–30 μm was observed
*7: Uneven structure having a pitch of 2–10 μm was observed.

TABLE 4

| | | Layer C | | Layer B | | Layer A | | |
|---|---|---|---|---|---|---|---|---|
| Sample No. | Substrate | Coating solution No. | Layer forming method | Coating solution No. | Layer forming method | Coating solution No. | Layer forming method | Observation result of surface |
| 2-13 | PET/AL composite substrate | — | — | B-7 | *2 | A-12 | *4 | *9 |
| 2-14 | PET/AL composite substrate | — | — | B-8 | *2 | A-3 | *4 | *9 |
| 2-15 | PET/AL composite substrate | — | — | B-8 | *2 | A-6 | *4 | *9 |
| 2-16 | PET/AL composite substrate | C-2 | *2 | B-9 | *1 | A-12 | *4 | *10 |
| 2-17 | PET/AL composite substrate | C-2 | *2 | B-10 | *1 | A-3 | *4 | *11 |
| 2-18 | PET/AL composite substrate | C-2 | *2 | B-12 | *1 | A-12 | *4 | *11 |
| 2-19 | PET/AL composite substrate | C-2 | *2 | B-12 | *6 | A-6 | *4 | *11 |
| 2-20 | PET/AL composite substrate | C-3 | *2 | B-11 | *1 | A-5 | *4 | *11 |
| 2-21 | PET/AL composite substrate | C-3 | *2 | B-12 | *1 | A-13 | *4 | *11 |
| 2-22 | PET/AL composite substrate | C-3 | *2 | B-12 | *5 | A-6 | *4 | *11 |
| 2-23 | PET substrate | — | — | B-1 | *2 | D-1 | *4 | *10 |
| 2-24 | PET/AL composite substrate | C-3 | *2 | B-9 | *1 | D-2 | *7 | *10 |
| 2-25 | PET/AL | C-2 | *2 | B-9 | *1 | D-3 | *8 | *10 |

TABLE 4-continued

| | | Layer C | | Layer B | | Layer A | | |
|---|---|---|---|---|---|---|---|---|
| Sample No. | Substrate | Coating solution No. | Layer forming method | Coating solution No. | Layer forming method | Coating solution No. | Layer forming method | Observation result of surface |
| | composite substrate | | | | | | | |

*1: Coated by a wire bar No. 5 and dried at 70° C. for 5 minutes
*2: Coated by a wire bar No. 10 and dried at 70° C. for 5 minutes
*4: Coated by a wire bar No. 4 and dried at 55° C. for 3 minutes
*5: Coated by a wire bar No. 4 and dried at 70° C. for 5 minutes
*6: Coated by a wire bar No. 7 and dried at 70° C. for 5 minutes
*7: Coated by a wire bar No. 8 and dried at 55° C. for 3 minutes
*8: Coated by a wire bar No. 5 and dried at 55° C. for 3 minutes
*9: Uneven structure having a pitch of 2–30 μm was observed.
*10: No regular uneven structure is observed
*11: Uneven structure having a pitch of 2–10 μm is observed The image formation and the printing were performed in the same manner as in Example 1.

Evaluation of the Prints

The evaluation was carried out as to the following items. Evaluated results are shown in Tables 5 and 6.

Evaluation of S/N Ratio

Evaluation of the S/N ratio was performed in the same manner as in Example 1.

Ink Adhering Ability

Number of the sheet necessary to unify the visual density of the solid image from the start of the printing was counted.

Resolution of Image

The line and space images of 500, 1,000, 2,000 and 4,000 dpi were observed using a loupe for evaluating the resolving degree of the reproduced image.

Background Staining

The reflective density of the printed surface of 1,000th, 2,000th and 10,000th printed papers. The difference of the density of the printed paper and that of the not printed paper is determined as the index of the background contamination.

Load for Occurrence of Staining Caused by Scratch

An anti-abrasion property measuring apparatus Heidon-18 having a sapphire needle of 0.1 mm of diameter was used. The needle was slid on the non-image area of the surface of the printing plate after image formation while the load on the needle was stepwise varied by 10, 25, 50, 75, 100, 125, and 150 g. The load necessary to form a scratch recognized as a stain on the printed image was evaluated.

Blanket Staining

Ink adhered on the blanket corresponding to the non-image area of the printing plate was taken off by a transparent adhesive tape. Then the adhesive tape was fixed on a sheet of white paper and the reflective density of the tape was measured. The difference between the thus measured reflective density and the density of the transparent adhesive tape fixed on the white paper without adhesion of the ink staining was determined as a measure of the blanket staining. Such the evaluation was performed as to the 1,000 and 10,000th print.

TABLE 5

| | Evaluation of print | | | | | | | | |
|---|---|---|---|---|---|---|---|---|---|
| | | | | Background staining | | | Blanket staining | | |
| Sample No. | S/N of image | Ink adhesion ability | Resolution of image | 1,000 th print | 10,000 th print | 20,000 th print | 1,000 th print | 10,000 th print | Scratch staining |
| 2-1 | Good | 15 sheets | 1000–2000 dpi | 0.000 | 0.000 | 0.003 | 0.07 | 0.45 | 125 g |
| 2-2 | Good | 15 sheets | 2000–4000 dpi | 0.000 | 0.000 | 0.000 | 0.06 | 0.40 | 125 g |
| 2-3 | Good | 15 sheets | 2000–4000 dpi | 0.000 | 0.000 | 0.000 | 0.05 | 0.30 | *1 |
| 2-4 | Good | 15 sheets | 2000–4000 dpi | 0.000 | 0.000 | 0.000 | 0.05 | 0.40 | 125 g |
| 2-5 | Good | 15 sheets | 2000–4000 dpi | 0.000 | 0.000 | 0.004 | 0.07 | 0.50 | *1 |
| 2-6 | Good | 15 sheets | 2000–4000 dpi | 0.000 | 0.000 | 0.000 | 0.06 | 0.50 | 125 g |
| 2-7 | Good | 15 sheets | 2000–4000 dpi | 0.000 | 0.000 | 0.000 | 0.05 | 0.35 | *1 |
| 2-8 | Good | 15 sheets | 2000–4000 | 0.000 | 0.000 | 0.005 | 0.07 | 0.45 | *1 |

TABLE 5-continued

| Sample No. | S/N of image | Ink adhesion ability | Resolution of image | Background staining 1,000 th print | Background staining 10,000 th print | Background staining 20,000 th print | Blanket staining 1,000 th print | Blanket staining 10,000 th print | Scratch staining |
|---|---|---|---|---|---|---|---|---|---|
| 2-9 | Good | 15 sheets | 2000–4000 dpi | 0.000 | 0.000 | 0.000 | 0.05 | 0.30 | *1 |
| 2-10 | Good | 15 sheets | 2000–4000 dpi | 0.000 | 0.000 | 0.000 | 0.06 | 0.45 | 125 g |
| 2-11 | Good | 15 sheets | 2000–4000 dpi | 0.000 | 0.000 | 0.000 | 0.06 | 0.45 | 125 g |
| 2-12 | Good | 15 sheets | 2000–4000 dpi | 0.000 | 0.000 | 0.000 | 0.07 | 0.50 | *1 |

*1: Contamination is not occurred at 150 g

TABLE 6

| Sample No. | S/N of image | Ink adhesion ability | Resolution of image | Background staining 1,000 th print | Background staining 10,000 th print | Background staining 20,000 th print | Blanket staining 1,000 th print | Blanket staining 10,000 th print | Scratch staining |
|---|---|---|---|---|---|---|---|---|---|
| 2-13 | Good | 15 sheets | 2000–4000 dpi | 0.000 | 0.000 | 0.000 | 0.07 | 0.50 | *2 |
| 2-14 | Good | 15 sheets | 2000–4000 dpi | 0.000 | 0.000 | 0.000 | 0.05 | 0.35 | 125 g |
| 2-15 | Good | 15 sheets | 2000–4000 dpi | 0.000 | 0.000 | 0.000 | 0.06 | 0.40 | 125 g |
| 2-16 | Good | 15 sheets | 2000–4000 dpi | 0.000 | 0.000 | 0.002 | 0.07 | 0.50 | *2 |
| 2-17 | Good | 15 sheets | 2000–4000 dpi | 0.000 | 0.000 | 0.000 | 0.05 | 0.30 | *2 |
| 2-18 | Good | 15 sheets | 2000–4000 dpi | 0.000 | 0.000 | 0.000 | 0.05 | 0.35 | 125 g |
| 2-19 | Good | 15 sheets | 2000–4000 dpi | 0.000 | 0.000 | 0.000 | 0.05 | 0.30 | 125 g |
| 2-20 | Good | 15 sheets | 2000–4000 dpi | 0.000 | 0.000 | 0.000 | 0.05 | 0.30 | *2 |
| 2-21 | Good | 15 sheets | 2000–4000 dpi | 0.000 | 0.000 | 0.000 | 0.06 | 0.40 | *2 |
| 2-22 | Good | 15 sheets | 2000–4000 dpi | 0.000 | 0.000 | 0.000 | 0.05 | 0.30 | 125 g |
| 2-23 | *1 | *1 | *1 | 0.006 | 0.050 | 0.080 | 0.35 | 0.70 | 50 g |
| 2-24 | *1 | *1 | *1 | 0.000 | 0.000 | 0.002 | 0.07 | 0.50 | *2 |
| 2-25 | Good | 15 sheets | 2000–4000 dpi | 0.000 | 0.006 | 0.010 | 0.20 | 0.55 | 25 g |

*1: No image can be obtained
*2: Contaminated is not occurred at 150 g

Tables 5 and 6 show that the printing plate element Samples 2-1 through 2-22 having the layer A according to the invention each have a good S/N ratio and printing properties. Particularly, the printing plate element excellent in the printing properties inhibited in the occurrence of the background contamination and the blanket contamination can be obtained by the combination with the hydrophilic layer B having the uneven structure with a pitch of from 0.1 to 50 μm.

Example 3

Examples of an ink-jet system are shown below.

Preparation of Ink-jet Recording Ink

An ink-jet recording ink was prepared in accordance with the following composition and the manner.

| Ink 1 (Acid-containing ink) | |
|---|---|
| The following materials were mixed and stirred, and filtered through a metal mesh filter to prepare Ink 1 | |
| Acid: Phosphoric acid | 3.0 g |
| Ultrapure water | 97.0 g |

| Ink 2 (Acid-containing ink/low density) | |
|---|---|
| Ink 2 was prepared in the same manner as in Ink 1 except that the composition of the ink was changed as follows. | |
| Acid: Phosphoric acid | 1.5 g |
| Ultrapure water | 97.0 g |

| Ink 3 (Black dye ink) | |
|---|---|
| Ink 3 was prepared in the same manner as in Ink 1 except that the composition of the ink was changed as follows. | |
| Light-heat conversion material: Suminol Fast Gray 3G (Sumitomo Kagaku Kogyo, Co., Ltd., C.I. Acid black 48) | 5.0 g |
| Ultrapure water | 95.0 g |

| Ink 4 (Black dye ink/Low density) | |
|---|---|
| Ink 4 was prepared in the same manner as in Ink 1 except that the composition of the ink was changed as follows. | |
| Light-heat conversion material: Suminol Fast Gray 3G (Sumitomo Kagaku Kogyo, Co., Ltd., C.I. Acid black 48) | 3.5 g |
| Ultrapure water | 96.5 g |

| Ink 5 (Infrared absorbing dye ink) | |
|---|---|
| Ink 5 was prepared in the same manner as in Ink 1 except that the composition of the ink was changed as follows. | |
| Light-heat conversion material: Phtalocyanine dye TX-112A (Nihon Shokubai Co., Ltd.) | 5.0 g |
| Ultrapure water | 95.0 g |

| Ink 6 (Infrared absorbing dye ink/Low density) | |
|---|---|
| Ink 6 was prepared in the same manner as in Ink 1 except that the composition of the ink was changed as follows. | |
| Light-heat conversion material; Phthalocyanine dye the same as the above | 3.5 g |
| Ultrapure water | 96.5 g |

| Ink 7 (Black pigment ink) | |
|---|---|
| The following materials were mixed according to the method described in JP O.P.I. No. 11-279470. The mixture was dispersed together with glass beads in an amount 1.5 times of the weight of the mixture for 2 hours by a sand grinder. The unit of the following component is part by weight. | |
| FW18 (Degauss Co., Ltd., C.I. Pigment black 7) | 5.0 |
| Poly(amino acid) derivative solution (Poly(amino acid) derivative solution A described in JP O.P.I. No. 11-279470, Solid content: 25% by weight) | 10.0 |
| Glycerol | 5.0 |
| Diethylene glycol | 5.0 |
| Ion-exchanged water | 65.0 |

After the dispersion, glass beads were filtered by a stainless steel mesh. Ninety seven parts by weight of thus obtained dispersed mixture was diluted by the addition of 3 parts by weight of triethylene glycol monobutyl ether and stirred for 2 hours. The mixture was filtered by a 3μ membrane filter to prepare Ink 7.

Ink 8 (Black pigment ink/Low density)

Ink 8 was prepared in the same manner as in Ink 7 except that the amount of the pigment FW18 and the ion-exchanged water were each changed to 2.5% by weight and 66.5% by weight, respectively.

Preparation of Printing Plate Element

Printing plate element samples 1 through 5 were prepared employing the substrate and the layer constitution, as shown in Table 7.

TABLE 7

| | | Layer B | | Layer A | | | |
|---|---|---|---|---|---|---|---|
| Sample No. | Substrate | Coating solution | Layer forming method | Coating solution | Layer forming method | Image forming method | Evaluation of print |
| 1 | PET | B-1 | *1 | A-1 | *2 | Ink-jet 1 | *3 |
| 2 | AL 1 | B-1 | *1 | A-2 | *2 | Ink-jet 1 | *3 |
| 3 | PET | B-1 | *1 | A-1 | *2 | Ink-jet 2 | *3 |
| 4 | PET | B-1 | *1 | A-2 | *2 | Ink-jet 3 | *3 |
| 5 | AL 2 | B-1 | *1 | A-1 | *2 | Ink-jet 4 | *3 |

*1: Coated by a wire bar No. 16 and dried at 70° C. for 5 minutes
*2: Coated by a wire bar No. 5 and dried at 55° C. for 3 minutes
*3: A print with a good S/N ratio was obtained Image Forming Process Image (latent image) formation was performed according to the following manner. Removal of non-image-forming areas of layer A was performed on a printing machine, as described later.

Ink-Jet Method 1 (Usual Black Ink)

An image was printed by ink-jet on the layer A by an ink-jet printer PM-700C, manufactured by Epson Co., Ltd., using the exclusive black ink. The image was a 8-bit gray scale bitmap image (720 dpi) including a 10 point character and a gradation image continuously varied from black to white.

The printer was set as follows:

Printing quality: Very fine

Kind of paper: Paper exclusive for very fine printing

Ink: Black

Halftone: High quality halftone

Microwave: Super

Two direction printing: None

Smoothing: With

Color control: Color compensation by driver, Automatic mode

Others; Default

After the recording by ink-jet, the printed ink was dried for 1 hour at an ordinary temperature and humidity (20° C., 60% RH). Then the layer A on which the image was recorded by the ink-jet was uniformly exposed to flash light using a xenon flash lamp to coagulate the image recorded area of the layer A. The optimum flash exposure condition was selected for each of the printing plate elements, and the samples each exposed under the optimum condition were used for the evaluation.

Ink-jet Method 2 (Acid-containing Ink)

Ink-jet recording was performed in the same manner as in the ink-jet method 1 except that Ink 1 was charged in the black ink cartridge. Then the printed image was dried for 1 hour or more at an ordinary temperature and humidity (20° C., 60% HR).

Ink-jet Method 3 (Pigment Ink)

Ink-jet recording, drying and flash exposing under the optimum condition were performed in the same manner as in Ink-jet method 1 except that Ink 7 was charged in the black ink cartridge.

Ink-jet Method 4 (Infrared Absorbing Dye Ink)

An image is recorded in the same manner as in Ink-jet method 1 except that the Ink 5 was charged in the black ink cartridge and the printed image was dried at an ordinary temperature and humidity (20° C., 60% RH) for 1 hour. Then the surface of the layer A, on which the image was recorded by the ink-jet was uniformly exposed to laser light by the use of an cylindrical outside drum type laser exposing apparatus with 32 ch multi-beam of wavelength of 830 nm having a resolving power of 4,000 dpi to thermally coagulate the image area on the surface of the layer A. The light beam was outfocused so that the beam diameter in of the sub-scanning direction at the surface of the layer A was become to 20 $\mu$m. The exposure energy was stepwise varied within the range of from 200 to 450 mj/cm$^2$ at every 50 mj/cm$^2$. The image formed by the optimal exposure was selected and subjected to the printing evaluation in each of the tested plates.

Printing Process

The plate on which a latent image was formed was subjected to the printing performance. The printing was performed by a printing machine DAIYA1F-1, manufacture by Mitsubishi Jukogyo Co., Ltd., using coated paper, Wetting liquid H Solution SG-51 in a concentration of 1.5%, manufactured Tokyo Ink Co, Ltd., and Ink Toyo King High Eco M (magenta), manufactured by Toyo Ink Co., Ltd. At the initial of the printing, the wetting liquid roller was firstly contacted only to the printing drum and rotated for 10 seconds while supplying the wetting liquid, then the printing was started in the usual procedure.

Evaluation of the Prints

Evaluation of S/N Ratio of Image

Thus obtained printed matter (the 500th sheet from the start of the printing) was observed by eyes and through a loupe. The evaluation was performed from the viewpoint of readability of 10 point characters regarding the print printed by the plate on which the image was formed by the ink-jet method, and the distinguish ability of the line and space image of 1,000 dpi regarding the print printed by the plate on which the image was formed by the laser exposure method. Thus obtained results are shown in Table 7.

As is shown in Table 7, the prints each having a high S/N ratio could be obtained by any of the printing plates.

Example 4

Examples of an ink-jet system are shown below.

Preparation of Printing Plate Element

Printing plate element samples 14 through 18 were prepared using the substrate and layer constitution, as shown in Table 8.

TABLE 8

| | | Layer B | | Layer A | | | |
|---|---|---|---|---|---|---|---|
| Sample No. | Substrate | Coating solution | Layer forming method | Coating solution | Layer forming method | Image forming method | Evaluation of print |
| 14 | PET | B-1 | *1 | A-1 | *2 | Ink-jet 5 | *3 |
| 15 | AL 1 | B-1 | *1 | A-2 | *2 | Ink-jet 5 | *4 |
| 16 | PET | B-1 | *1 | A-1 | *2 | Ink-jet 6 | *5 |
| 17 | PET | B-1 | *1 | A-2 | *2 | Ink-jet 7 | *6 |
| 18 | AL 2 | B-1 | *1 | A-1 | *2 | Ink-jet 8 | *7 |

*1: Coated by a wire bar No. 16 and dried at 70° C. for 5 minutes
*2: Coated by a wire bar No. 5 and dried at 55° C. for 3 minutes
*3: Prints with smooth image reproduction, as compared to Sample 1
*4: Prints with smooth image reproduction, as compared to Sample 2
*5: Prints with smooth image reproduction, as compared to Sample 3
*6: Prints with smooth image reproduction, as compared to Sample 4
*7: Prints with smooth image reproduction, as compared to Sample 5

Image Forming Process

An images (latent image) was formed on each of the printing plate elements of Examples 14 through 18 by the combination show in Table, 2 according to the following procedures. The removing of the non-image formed area of the layer A was performed on the printing machine.

Ink-jet Method 5 (High and Low Density Dye Ink)

An image was printed by ink-jet on the layer A by an ink-jet printer PM-700C, manufactured by Seiko-Epson Co., Ltd., in which Ink 3 and Ink 4 were each charged in the magenta and light magenta ink cartridges, respectively, and pure water was charged in the other cartridges. The image includes a 10 point magenta character and a gradation image continuously varied from magenta to white.

The printer was set as follows:

Printing quality: Very fine

Kind of paper: Paper exclusive for very fine printing

Ink: Color

Halftone: High quality halftone

Microwave: Super

Two direction printing: None

Smoothing: With

Color control: Color compensation by driver, Automatic mode

Others; Default

After the recording by ink-jet, the printed ink was dried for 1 hour at an ordinary temperature and humidity (20° C., 60% RH). Then the layer A on which the image was recorded by the ink-jet was uniformly flash exposed by a xenon flash lamp to coagulate the image recorded area of the layer A. The optimum flash exposure condition was selected for each of the printing plate element, and the samples each exposed under the optimum condition were used for the evaluation.

Ink-jet Method 6 (High and Low Density Acid-containing Inks)

The image recording was performed in the same manner as in Ink-jet method 5 except that Ink 1 and Ink 2 were each charged in the magenta and light magenta cartridges of the printer, respectively. Then inks were dried at an ordinary temperature and humidity (20° C., 60% RH) for 1 hour.

Ink-jet Method 7 (High and Low Density Pigment Ink)

The ink-jet recording, drying and flash exposing (optimum condition) were performed in the same manner as in Ink-jet method 1 except that Ink 7 and Ink 8 were each charged in magenta and light magenta cartridges of the printer, respectively.

Ink-jet method 8 (High and Low Density Infrared Absorbing Dye Inks)

The image recording was performed in the same manner as in Ink-jet method 1 except that Ink 5 and Ink 6 were each charged in the magenta and light magenta cartridges of the printer, respectively. Then inks were dried at an ordinary temperature and humidity (20° C., 60% RH) for 1 hour.

Then the surface of the layer A, on which the image was recorded by the ink-jet was uniformly exposed to laser light by the use of an cylindrical outside drum type laser exposing apparatus with 32 ch multi-beam of wavelength of 830 nm having a resolving power of 4,000 dpi to thermally coagulate the image area on the surface of the layer A. The light beam was outfocused so that the beam diameter in of the sub-scanning direction at the surface of the layer A was become to 20 $\mu$m. The exposure energy was stepwise varied within the range of from 200 to 450 mj/cm$^2$ at every 50 mj/cm$^2$. The image formed by the optimal exposure was selected and subjected to the printing evaluation in each of the tested plates.

Printing Process

Printing was performed in the same manner as in Example 1.

Evaluation of the Prints

Evaluation of Gradation Image

Thus obtained printed matter (the 500th sheet from the star to printing) was visually observed to evaluate the smoothness of gradation of the gradation image. Results of the evaluation are shown in Table 8.

As is shown in Table 8, the prints printed by the printing plate samples 14 through 18 formed by the ink-jet method using two kinds of the ink each gave the gradation image with a higher gradation smoothness compared with the prints printed by the printing print using one kind of the ink.

Effect of the Invention

According to the invention, a process-less printing plate element having a good printing suitability. Excellent effect can be obtained by the invention that the printing plate element which is easily handled in a lighted room and the image can be directly formed by irradiation by an infrared laser without contamination of interior of the exposing apparatus caused by the laser irradiation and necessity of any specific developing treatment. Further, the printing palate can be easily handled without anxiety of the occurrence of staining caused by scratching. The resolving ability of the printing plate element is also excellent.

In addition the foregoing, according to the invention, the printing plate can be prepared employing low-priced materials and thinner coating, leading to reduction in manufacturing cost. Furthermore, there can be provided printing plate superior in environment safety and rapid access can achieved.

Disclosed embodiments can be varied by a skilled person without departing from the spirit and scope of the invention.

What is claimed is:

1. A printing plate element comprising a substrate and a first component layer, wherein the first component layer contains a first material which is water-insoluble or capable of varying from being water-soluble to being water-insoluble at a prescribed temperature of not less than 60° C. and a second material which is water-soluble and has a melting point of 60 to 300° C., and said second material being an oligosaccharide.

2. The printing plate element of claim 1, wherein the second material is a crystalline material.

3. The printing plate element of claim 1, wherein the printing plate element comprises a second hydrophilic component layer provided between the substrate and the first component layer.

4. The printing plate element of claim 3, wherein the second component layer is a porous layer.

5. The printing plate element of claim 3, wherein the second component layer contains a light-heat conversion material.

6. The printing plate element of claim 3, wherein the second component layer contains an alkaline colloidal silica and a water-soluble polysaccharide.

7. The printing plate element of claim 3, wherein the second component layer has a protruding surface structure having a pitch of from 0.1 to 50 $\mu$m.

8. The printing plate element of claim 3, wherein the printing element comprises a third component layer provided between the substrate and the second component layer, the third component layer containing a light-heat conversion material.

9. The printing plate element of claim 1, wherein the first material is a material 1*a* which is water-insoluble and has a melting point of 60 to 300° C.

10. The printing plate element of claim 9, wherein the melting point of the second material is higher than that of the material 1*a*.

11. The printing plate element of claim 9, wherein the material 1*a* is in the form of particles having an average particle size of 0.01 to 10 μm.

12. The printing plate element of claim 9, wherein the material 1*a* is at least one selected from the group consisting of polyethylene, a microcrystalline wax, a fatty acid and a fatty acid ester.

13. The printing plate element of claim 1, wherein the first material is a material 1*b* which is water-soluble and capable of coagulating at a prescribed temperature of not less than 60° C. to form a water-insoluble coagulant.

14. The printing plate element of claim 13, wherein the material 1*b* is at least one selected from the group consisting of a water-soluble protein and a water-soluble glycoprotein.

15. The printing plate element of claim 1, wherein the second material has a melting point of 70 to 260° C.

16. The printing plate element of claim 1, wherein the oligosaccharide is at least one selected from the group consisting of trehalose, maltose, galactose, sucrose, lactose and raffinose.

17. The printing plate element of claim 16, wherein the oligosaccharide is trehalose.

18. A method of preparing a printing plate comprising the steps of:

(a) imagewise exposing a printing plate element to laser light and (b) removing an unexposed area of the printing plate element with an aqueous solution, wherein the printing plate element comprises a substrate and a first component layer containing a first material which is water-insoluble or capable of varying from being water-soluble to being water-insoluble at a prescribed temperature of not less than 60° C. and a second material which is water-soluble and has a melting point of 60 to 300° C. and said second material being an oligosaccharide, and wherein in step (b), an unexposed area of the first component layer is removed with the aqueous solution.

19. The method of claim 18, wherein step (b) is performed on a printing machine.

20. A printing plate element comprising a substrate and a first component layer, wherein the first component layer contains a first material which is water-insoluble or capable of varying from being water-soluble to being water-insoluble at a prescribed temperature of not less than 60° C. and a second material which is water-soluble and has a melting point of 60 to 300° C., and wherein the printing plate element comprises a second hydrophilic component layer provided between the substrate and the first component layer and a third component layer provided between the substrate and the second component layer, the third component layer containing a lightheat conversion material.

* * * * *